(12) United States Patent
Kim et al.

(10) Patent No.: US 10,020,348 B2
(45) Date of Patent: Jul. 10, 2018

(54) ORGANIC LIGHT EMITTING DISPLAY DEVICE WITH MULTIPLE EMISSION LAYERS

(71) Applicant: LG Display Co., Ltd., Seoul (KR)

(72) Inventors: Taeshick Kim, Gyeonggi-do (KR); Younseok Kam, Seoul (KR); Seung Kim, Seoul (KR); Jaeseung Jang, Seoul (KR); Mingyu Lee, Daegu (KR)

(73) Assignee: LG Display Co., Ltd., Seoul (KR)

( * ) Notice: Subject to any disclaimer, the term of this patent is extended or adjusted under 35 U.S.C. 154(b) by 29 days.

(21) Appl. No.: 15/469,779

(22) Filed: Mar. 27, 2017

(65) Prior Publication Data

US 2017/0287985 A1 Oct. 5, 2017

(30) Foreign Application Priority Data

Mar. 29, 2016 (KR) .................. 10-2016-0037653

(51) Int. Cl.
*H01L 27/32* (2006.01)
*H01L 25/04* (2014.01)
*H01L 51/50* (2006.01)

(52) U.S. Cl.
CPC ........ *H01L 27/3209* (2013.01); *H01L 25/048* (2013.01); *H01L 51/504* (2013.01)

(58) Field of Classification Search
CPC .................................................. H01L 51/5262
See application file for complete search history.

(56) References Cited

U.S. PATENT DOCUMENTS

| 8,350,257 | B2 | 1/2013 | Pieh et al. |
| 2005/0206305 | A1 | 9/2005 | Masuda et al. |
| 2007/0001588 | A1 | 1/2007 | Boroson et al. |
| 2008/0278066 | A1 | 11/2008 | Spindler et al. |
| 2013/0002132 | A1* | 1/2013 | Cheon ................. H01L 51/0003 313/504 |
| 2014/0167016 | A1* | 6/2014 | Yoo ..................... H01L 51/5028 257/40 |
| 2015/0034923 | A1* | 2/2015 | Kim .................... H01L 51/5044 257/40 |
| 2015/0280159 | A1 | 10/2015 | Kim et al. |
| 2017/0155055 | A1* | 6/2017 | Joo ..................... H01L 51/0054 |

FOREIGN PATENT DOCUMENTS

KR    10-2011-0035048 A    4/2011

* cited by examiner

*Primary Examiner* — Joseph L Williams
(74) *Attorney, Agent, or Firm* — Morgan, Lewis & Bockius LLP

(57) ABSTRACT

An organic light emitting display device includes a first emission part between an anode and a cathode and a second emission part on the first emission part. At least one of the first emission part and the second emission part includes at least three emission layers emitting lights of different colors, and one of the at least three emission layers include a green emission layer including a phosphorescent material. Accordingly, a lifetime and color reproduction rate of the organic light emitting display device having green lifetime is enhanced.

20 Claims, 8 Drawing Sheets

ORGANIC LIGHT EMITTING DISPLAY DEVICE WITH MULTIPLE EMISSION LAYERS

CROSS-REFERENCE TO RELATED APPLICATIONS

This application claims the benefit of the Korean Patent Application No. 10-2016-0037653 filed on Mar. 29, 2016, which is hereby incorporated by reference as if fully set forth herein.

BACKGROUND

Field of the Invention

The present disclosure relates to an organic light emitting display device, and more particularly, to an organic light emitting display device with enhanced efficiency, lifetime, or color reproduction rate.

Discussion of the Related Art

Recently, as society advances to the information-oriented society, the field of display devices which visually express an electrical information signal is rapidly advancing. Various display devices, having excellent performance in terms of thinness, lightness, and low power consumption, are being developed correspondingly.

Examples of the display devices include liquid crystal display (LCD) devices, plasma display panel (PDP) devices, field emission display (FED) devices, organic light emitting display devices, etc.

Particularly, the organic light emitting display devices are self-emitting devices. In comparison with other display devices, the organic light emitting display devices have a fast response time, high emission efficiency, high luminance, and a wide viewing angle and thus are attracting much attention. Also, as organic light emitting display devices for emitting white light have been developed recently, the organic light emitting display devices are widely applied to various fields such as backlights, lighting devices, etc., and are being recognized as the most important display devices.

An example of white organic light emitting device is discussed in Korean Patent Application No. 2009-0092596 (U.S. Pat. No. 8,350,257).

SUMMARY

An organic light emitting device has limitations of emission efficiency and lifetime caused by a material of an organic light emitting layer and a structure of the organic light emitting device, and for this reason, various methods for enhancing an emission efficiency or lifetime of an emission layer in the organic light emitting device are being proposed.

In one method, a structure may be provided where white light is emitted by stacking two emission layers having a complementary color relationship. However, in the structure, a difference between a wavelength range of an electroluminescent (EL) peak of each emission layer and a transmission area or range of a color filter occurs when white light passes through the color filter. For this reason, a color range where colors are realized is narrowed, and consequently, it is difficult to realize a desired color reproduction rate.

For example, when a blue emission layer and a yellow emission layer are stacked, an EL peak wavelength is provided in a blue wavelength range and a yellow wavelength range, and thus, white light is emitted. When the white light passes through each of red, green, and blue color filters, a transmittance in a blue wavelength range is lower compared to a transmittance in a red or green wavelength range, and for this reason, emission efficiency and a color reproduction rate are lowered.

Also, an emission efficiency of a yellow phosphorescence emission layer is relatively higher than that of a blue phosphorescence emission layer, and thus, efficiency and a color reproduction rate are reduced due to an efficiency difference between a phosphorescence emission layer and a fluorescence emission layer.

And, since a transmittance is lowered when adjusting a color filter for increasing a color reproduction rate, efficiency is reduced, and lifetime is shortened.

Therefore, the inventors have recognized the above-described problems and have experimented on various methods for increasing an emission efficiency of an emission layer and a lifetime and color reproduction rate of an organic light emitting device. Through various experiments, the inventors have invented an organic light emitting display device having a new structure for enhancing efficiency, lifetime, and a color reproduction rate.

Accordingly, the present invention is directed to an organic light emitting display device that substantially obviates one or more problems due to limitations and disadvantages of the related art.

An object of the present disclosure is to provide an organic light emitting display device for enhancing efficiency, lifetime, and a color reproduction rate.

The objects of the present disclosure are not limited to the aforesaid, but other objects not described herein will be clearly understood by those skilled in the art from descriptions below.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

According to one example, an organic light emitting display device comprises a first emission part between an anode and a cathode and a second emission part on the first emission part, wherein at least one of the first emission part and the second emission part includes at least three emission layers emitting lights of different colors, and one of the at least three emission layers include a green emission layer including a phosphorescent material.

In another aspect, an organic light emitting display device comprises at least two emission parts stacked between an anode and a cathode, wherein at least one of the at least two emission parts includes a first emission layer, a second emission layer including a phosphorescent material for emitting green light, and a third emission layer configured for enhancing a color reproduction rate and lifetime of the phosphorescent material.

Details of embodiments are included in a detailed description and the drawings.

It is to be understood that both the foregoing general description and the following detailed description of the present disclosure are exemplary and explanatory and are intended to provide further explanation of the disclosure as claimed.

BRIEF DESCRIPTION OF THE DRAWINGS

The accompanying drawings, which are included to provide a further understanding of the disclosure and are incorporated in and constitute a part of this application, illustrate embodiments of the disclosure and together with the description serve to explain the principle of the disclosure. In the drawings.

DETAILED DESCRIPTION

Figure 1:
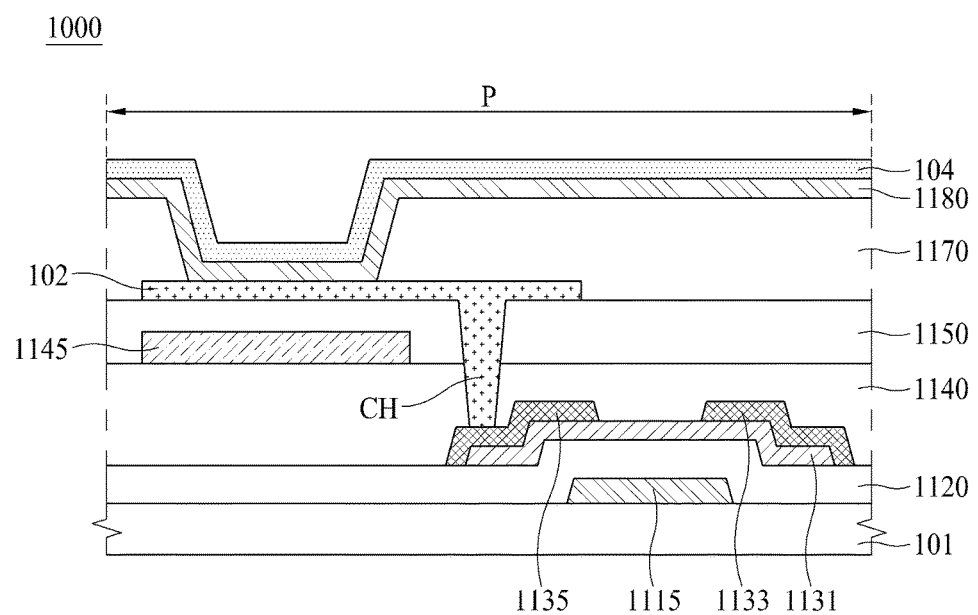
FIG. 1 is a diagram illustrating an organic light emitting display device according to an embodiment of the present disclosure.

Reference will now be made in detail to the exemplary embodiments of the present disclosure, examples of which are illustrated in the accompanying drawings. Wherever possible, the same reference numbers will be used throughout the drawings to refer to the same or like parts.

Advantages and features of the present disclosure, and implementation methods thereof will be clarified through following embodiments described with reference to the accompanying drawings. The present disclosure may, however, be embodied in different forms and should not be construed as limited to the embodiments set forth herein. Rather, these embodiments are provided so that this disclosure will be thorough and complete, and will fully convey the scope of the present disclosure to those skilled in the art. Further, the present disclosure is only defined by scopes of claims.

A shape, a size, a ratio, an angle, and a number disclosed in the drawings for describing embodiments of the present disclosure are merely an example, and thus, the present disclosure is not limited to the illustrated details. Same reference numerals refer to same elements throughout. In the following description, when the detailed description of the relevant known function or configuration is determined to unnecessarily obscure the important point of the present disclosure, the detailed description will be omitted. In a case where 'comprise', 'have', and 'include' described in the present specification are used, another part may be added unless 'only~' is used. The terms of a singular form may include plural forms unless referred to the contrary.

In construing an element, the element is construed as including an error range although there is no explicit description.

In describing a position relationship, for example, when a position relation between two parts is described as 'on~', 'over~', 'under~', and 'next~', one or more other parts may be disposed between the two parts unless 'just' or 'direct' is used.

In describing a time relationship, for example, when the temporal order is described as 'after~', 'subsequent~', 'next~', and 'before~', a case which is not continuous may be included unless 'just' or 'direct' is used.

It will be understood that, although the terms "first", "second", etc. may be used herein to describe various elements, these elements should not be limited by these terms. These terms are only used to distinguish one element from another. For example, a first element could be termed a second element, and, similarly, a second element could be termed a first element, without departing from the scope of the present disclosure.

Features of various embodiments of the present disclosure may be partially or overall coupled to or combined with each other, and may be variously inter-operated with each other and driven technically as those skilled in the art can sufficiently understand. The embodiments of the present disclosure may be carried out independently from each other, or may be carried out together in co-dependent relationship.

Hereinafter, embodiments of the present disclosure will be described in detail with reference to the accompanying drawings.

FIG. 1 is a diagram illustrating an organic light emitting display device 1000 according to an embodiment of the present disclosure.

Referring to FIG. 1, the organic light emitting display device 1000 may include a substrate 101, a first electrode 102, an emission part 1180, and a second electrode 104. The organic light emitting display device 1000 may include a plurality of pixels P. A pixel P denotes an area corresponding to a minimum unit where light is actually emitted, and may be referred to as a subpixel or a pixel area. Also, a plurality of pixels P may constitute a minimum group for realizing white light. For example, three pixels may constitute one group, namely, a red pixel, a green pixel, and a blue pixel may constitute one group. Alternatively, four pixels may constitute one group, namely, a red pixel, a green pixel, a blue pixel, and a white pixel may constitute one group. However, the present embodiment is not limited thereto, and various pixel designs may be made. In FIG. 1, for convenience of description, only one pixel P is illustrated.

The TFT may include a gate electrode 1115, a gate insulation layer 1120, a semiconductor layer 1131, a source electrode 1133, and a drain electrode 1135. The TFT may be disposed on the substrate 101 and may supply a signal to an organic light emitting device or an organic light emitting diode which includes the first electrode 102, the emission part 1180, and the second electrode 104. The TFT illustrated in FIG. 1 may be a driving TFT connected to the first electrode 102. A switching TFT or a capacitor for driving the organic light emitting device may be further disposed on the substrate 101. Also, in FIG. 1, the TFT is illustrated as having an inverted staggered structure, but may be formed in a coplanar structure.

The substrate 101 may be formed of an insulating material or a material having flexibility. The substrate 101 may be formed of glass, metal, plastic, and/or the like, but is not limited thereto. If the organic light emitting display device 1000 is a flexible organic light emitting display device, the substrate 101 may be formed of a flexible material such as plastic and/or the like. Also, if the organic light emitting device which is easy to realize flexibility is applied to a lighting device for vehicles or a display device for vehicles, various designs and a degree of freedom of design of a lighting device or a lighting apparatus for vehicles or a display device for vehicles are secured according to a structure or an appearance of a vehicle.

The gate electrode 1115 may be formed on the substrate 101 and may be connected to a gate line. The gate electrode 1115 may include a multilayer formed of one material among molybdenum (Mo), aluminum (Al), chromium (Cr), gold (Au), titanium (Ti), nickel (Ni), neodymium (Nd), and copper (Cu) or an alloy thereof.

The gate insulation layer 1120 may be formed on the gate electrode 1115. The gate insulation layer 1120 may be formed of silicon oxide (SiOx), silicon nitride (SiNx), or a multilayer thereof, but is not limited thereto.

The semiconductor layer 1131 may be formed on the gate insulation layer 1120. The semiconductor layer 1131 may be formed of amorphous silicon (a-Si), polycrystalline silicon (poly-Si), oxide semiconductor, organic semiconductor, and/or the like. In a case where the semiconductor layer 1131 is formed of oxide semiconductor, the semiconductor layer 1131 may be formed of indium tin oxide (ITO), indium zinc oxide (IZO), indium tin zinc oxide (ITZO), and/or the like, but is not limited thereto. Also, an etch stopper may be formed on the semiconductor layer 1131 and may protect the semiconductor layer 1131, but may be omitted depending on a configuration of the organic light emitting device.

The source electrode 1133 and the drain electrode 1135 may be formed on the semiconductor layer 1131. The source electrode 1133 and the drain electrode 1135 may each be formed of a single layer or a multilayer, and may be formed of one material among molybdenum (Mo), aluminum (Al), chromium (Cr), gold (Au), titanium (Ti), nickel (Ni), neodymium (Nd), and copper (Cu) or an alloy thereof.

A passivation layer 1140 may be formed on the source electrode 1133 and the drain electrode 1135. The passivation layer 1140 may be formed of SiOx, SiNx, or a multilayer thereof. Alternatively, the passivation layer 1140 may be formed of an acryl resin or a polyimide resin, but is not limited thereto.

A color layer 1145 may be formed on the passivation layer 1140. Although only one pixel P is illustrated in the drawing, the color layer 1145 may be formed in each of a red pixel, a blue pixel, and a green pixel. The color layer 1145 may include a red (R) color filter, a green (G) color filter, and a blue (B) color filter which are patterned and formed in respective pixels. The color layer 1145 transmits light having only a specific wavelength among white lights emitted from the emission part 1180.

An overcoating layer 1150 may be formed on the color layer 1145. The overcoating layer 1150 may be formed of an acryl resin, a polyimide resin, SiOx, SiNx, or a multilayer thereof, but is not limited thereto.

The first electrode 102 may be formed on the overcoating layer 1150. The first electrode 102 may be formed of indium tin oxide (ITO) or indium zinc oxide (IZO) which is a transparent conductive material such as transparent conductive oxide (TCO), but is not limited thereto. The first electrode 102 may be electrically connected to the drain electrode 1135 through a contact hole CH which is formed in a certain area of each of the passivation layer 1140 and the overcoating layer 1150. In FIG. 1, the drain electrode 1135 is illustrated as being electrically connected to the first electrode 102, but the present embodiment is not limited thereto. In other embodiments, the source electrode 1133 may be electrically connected to the first electrode 102 through the contact hole CH which is formed in the certain area of each of the passivation layer 1140 and the overcoating layer 1150.

The organic light emitting display device 1000 of FIG. 1 may be a bottom emission type, light emitted from the emission part 1180 may be transferred in a down direction through the first electrode 102. Also, when the organic light emitting display device 1000 is a top emission type, the light emitted from the emission part 1180 may be transferred in an up direction through the second electrode 104.

A bank layer 1170 may be formed on the first electrode 102 and may define a pixel area. That is, the bank layer 1170 may be formed in a matrix structure in a boundary area between a plurality of pixels, and thus, the pixel area may be defined by the bank layer 1170. The bank layer 1170 may be formed of an organic material such as a benzocyclobutene (BCB) resin, an acryl resin, a polyimide resin, and/or the like.

The emission part 1180 may be formed on the bank layer 1170 and the first electrode 102.

The second electrode 104 may be formed on the emission part 1180. The second electrode 104 may be formed of gold (Au), silver (Ag), aluminum (Al), molybdenum (Mo), magnesium (Mg), and/or the like or may be formed of an alloy thereof, but is not limited thereto.

Moreover, an encapsulation part may be formed on the second electrode 104. The encapsulation part prevents moisture from penetrating into the emission part 1180. The encapsulation part may include a plurality of layers where different inorganic materials are stacked, or may include a plurality of layers where an inorganic material and an organic material are alternately stacked. Also, an encapsulation substrate may be further provided on the encapsulation part. The encapsulation substrate may be formed of glass or plastic, or may be formed of metal. The encapsulation substrate may be adhered to the encapsulation part by an adhesive.

Moreover, the organic light emitting device configuring the emission part 1180 in FIG. 1 will be described below with reference to FIGS. 2 to 5.

Figure 2:
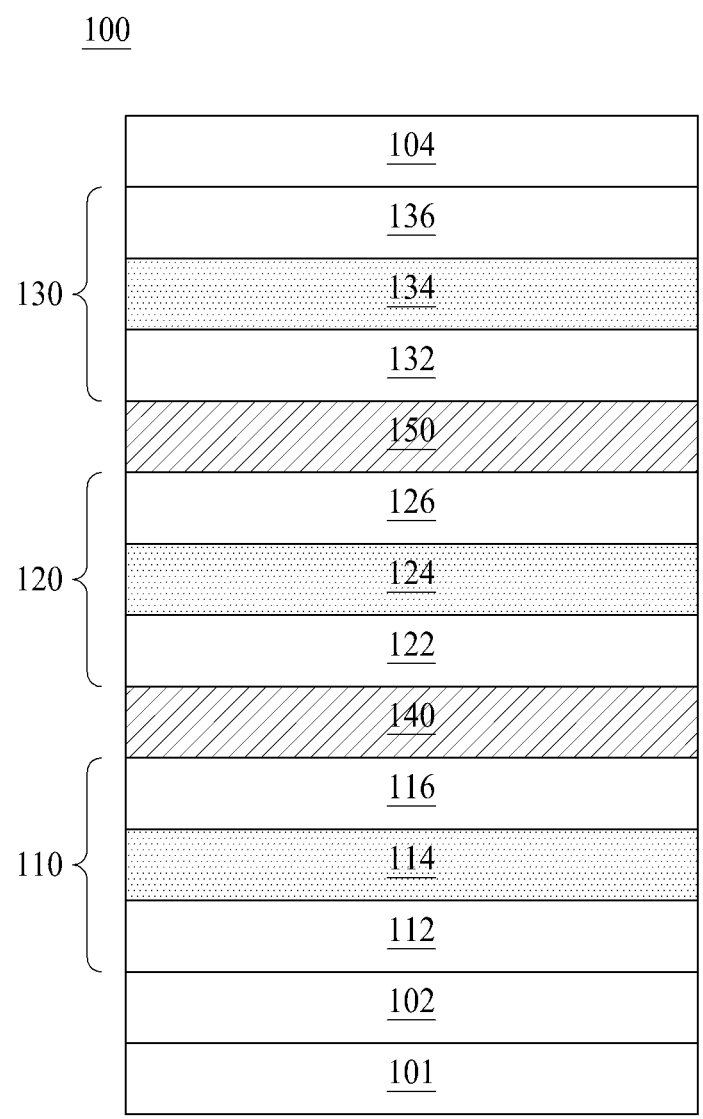
FIG. 2 is a diagram illustrating an organic light emitting device according to a first embodiment of the present disclosure.

FIG. 2 is a diagram illustrating an organic light emitting device 100 according to a first embodiment of the present disclosure.

The organic light emitting device 100 according to the first embodiment of the present disclosure illustrated in FIG. 2 may include a substrate 101, a first electrode 102, a second electrode 104, and first to third emission parts 110 to 130 between the first and second electrodes 102 and 104.

The first emission part 110 may include a first hole transport layer (HTL) 112, a first emission layer (EML) 114, and a first electron transport layer (ETL) 116 which are disposed on the first electrode 102.

The second emission part 120 may include a second HTL 122, a second EML 124, and a second ETL 126 which are disposed on the first emission part 110.

A first charge generation layer (CGL) 140 may be formed between the first emission part 110 and the second emission part 120. The first CGL 140 may adjust a charge balance between the first emission part 110 and the second emission part 120.

The third emission part 130 may include a third HTL 132, a third EML 134, and a third ETL 136 which are disposed on the second emission part 120.

A second CGL 150 may be formed between the second emission part 120 and the third emission part 130. The second CGL 150 may adjust a charge balance between the second emission part 120 and the third emission part 130.

In FIG. 2, the first EML 114 and the third EML 134 may each be formed as a blue EML, for enhancing blue efficiency. Also, the second EML 124 may be formed as a yellow-green EML, for enhancing green efficiency and red efficiency. However, since the yellow-green EML should realize all of red and green, it is difficult to realize a desired color reproduction rate, and red efficiency or lifetime is reduced.

And, when a green EML instead of a yellow-green EML is applied, a color reproduction rate is enhanced, but the green EML which is phosphorescent is better in efficiency than the yellow-green EML but is shorter in lifetime than the yellow-green EML. To provide a description on this, a color (for example, red, green, and blue) of an organic light emitting display device may be determined based on an energy band gap of an EML. An energy band gap which is wider than an energy band gap necessary for realizing yellow-green is needed for realizing green. Therefore, in comparison with an EML having a narrow energy band gap, an EML having a wide energy band gap is damaged in emitting light, and for this reason, its lifetime is shortened. A lifetime of green based on a phosphorescent material is about 40% of a lifetime of yellow-green, and for this reason, it is difficult to apply green to the organic light emitting display device. However, although a lifetime of green is short, the inventors have recognized that green is necessary for realizing a high color reproduction rate based on requirements of market desiring to realize a natural color, and have done research on green. Also, when a red EML is further provided for enhancing red efficiency, red efficiency is low, and for this reason, it is unable to apply it to the organic light emitting display device.

Therefore, the inventors have done various experiments for enhancing a color reproduction rate without any reduction in green lifetime even when a green EML which is phosphorescent is provided. Also, the inventors have done various experiments for enhancing red efficiency and a color reproduction rate by providing a yellow-green EML and a red EML. In order to solve a problem where green lifetime is shortened when only the green EML is provided, the inventors have invented, through several experiments, a new organic light emitting display device where the green EML which is phosphorescent and the yellow-green EML are provided together, and a color reproduction rate is enhanced without any reduction in green lifetime. Also, the inventors have further applied the red EML in addition to the green EML and the yellow-green EML so as to enhance red efficiency, thereby enhancing red efficiency and realizing a high color reproduction rate.

Another embodiment of the present disclosure on this will be described below with reference to FIGS. 3 to 5.

Figure 3:
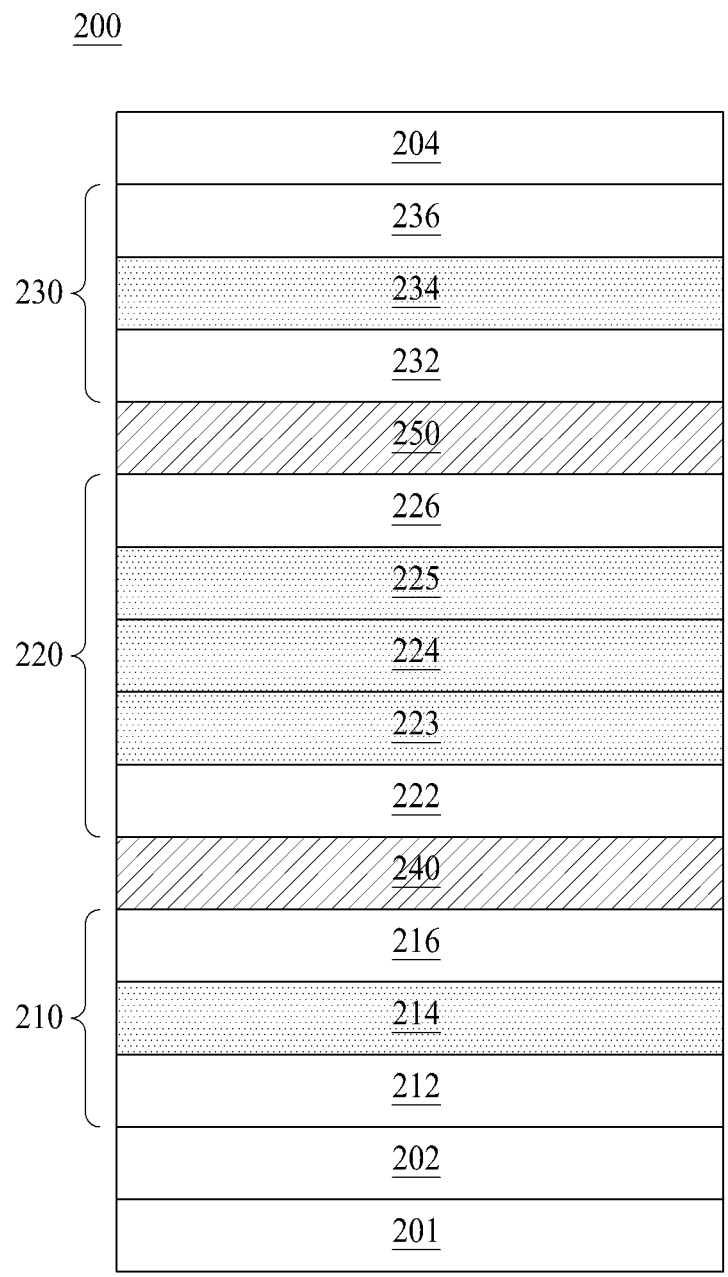
FIG. 3 is a diagram illustrating an organic light emitting device according to a second embodiment of the present disclosure.

FIG. 3 is a diagram illustrating an organic light emitting device 200 according to a second embodiment of the present disclosure.

The organic light emitting device 200 according to the second embodiment of the present disclosure illustrated in FIG. 3 may include a substrate 201, a first electrode 202, a second electrode 204, and first to third emission parts 210 to 230 between the first and second electrodes 202 and 204.

The substrate 201 may be formed of an insulating material or a material having flexibility. The substrate 201 may be formed of glass, metal, plastic, and/or the like, but is not limited thereto. If an organic light emitting display device is a flexible organic light emitting display device, the substrate 201 may be formed of a flexible material such as plastic and/or the like. Also, if the organic light emitting device which is easy to realize flexibility is applied to a lighting device for vehicles or a display device for vehicles, various designs and a degree of freedom of design of a lighting device or a lighting apparatus for vehicles or a display device for vehicles are secured according to a structure or an appearance of a vehicle.

The first electrode 202 is an anode that supplies a hole, and may be formed of indium tin oxide (ITO), indium zinc oxide (IZO), or the like which is a transparent conductive material such as transparent conductive oxide (TCO). However, the present embodiment is not limited thereto.

The second electrode 204 is a cathode that supplies an electron, and may be formed of gold (Au), silver (Ag), aluminum (Al), molybdenum (Mo), magnesium (Mg), lithium fluoride (LiF), and/or the like which is a metal material, or may be formed of an alloy thereof. The second electrode 204 may be formed a single layer or a multilayer. However, the present embodiment is not limited thereto.

Each of the first electrode 202 and the second electrode 204 may be referred to as an anode or a cathode. Alternatively, the first electrode 202 may be formed as a transmissive electrode, and the second electrode 204 may be formed as a reflective electrode. Alternatively, the first electrode 202 may comprise a transparent electrode, and the second electrode 204 may comprise a reflective electrode.

The first emission part 210 may include a first HTL 212, a first EML 214, and a first ETL 216 which are disposed on the first electrode 202.

A hole injection layer (HIL) may be further formed on the first electrode 202. The HIL may smoothly inject a hole, supplied from the first electrode 202, into the first EML 214.

The first HTL 212 may be formed of two or more layers or two or more materials.

The first HTL 212 may supply a hole, supplied from the first electrode 202 or the HIL, to the first EML 214. The first ETL 216 may supply an electron, supplied from the second electrode 204, to the first EML 214. Therefore, holes supplied through the first HTL 212 and electrons supplied through the first ETL 216 may be recombined in the first EML 214, thereby emitting light.

The first ETL 216 may be formed of two or more layers or two or more materials. An electron injection layer (EIL) may be further formed on the first ETL 216.

A hole blocking layer (HBL) may be further formed on the first EML 214. The HBL prevents a hole, injected into the first EML 214, from being transferred to the first ETL 216 and thus enhances a combination of an electron and a hole in the first EML 214, thereby enhancing an emission efficiency of the first EML 214. The first ETL 216 and the HBL may be provided as one layer.

An electron blocking layer (EBL) may be further formed under the first EML 214. The EBL prevents an electron, injected into the first EML 214, from being transferred to the first HTL 212 and thus enhances a combination of an electron and a hole in the first EML 214, thereby enhancing an emission efficiency of the first EML 214. The first HTL 212 and the EBL may be provided as one layer.

The first EML 214 may be an EML emitting light of a first color. That is, the first EML 214 may include one of a blue EML, a deep blue EML, and a sky blue EML.

Here, a peak wavelength (max) may denote a maximum wavelength of electroluminescence (EL). A wavelength where each of organic layers configuring an emission part emits unique light may be photoluminescence (PL), and light which is emitted based on an influence of a thickness or optical characteristic of layers configuring the organic layers may be emittance. Also, EL may denote light which is finally emitted from an organic light emitting display device, and may be expressed as a multiplication of PL and emittance.

The first HTL 212, the first EML 214, the first ETL 216, the HIL, the EIL, the HBL, and the EBL may each be referred to as an organic layer.

The second emission part 220 may include a second HTL 222, a second EML 223, a third EML 224, a fourth EML 225, and a second ETL 226 which are disposed on the first emission part 210.

Holes supplied through the second HTL 212 and electrons supplied through the second ETL 236 may be recombined in the second to fourth EMLs 223 to 225, thereby emitting light.

An EIL may be further formed on the second ETL 226. Also, an HIL may be further formed under the second HTL 222.

An HBL may be further formed on the fourth EML 225. The HBL prevents a hole, injected into the fourth EML 225, from being transferred to the second ETL 226 and thus enhances a combination of an electron and a hole in the fourth EML 225, thereby enhancing an emission efficiency of the fourth EML 225. The second ETL 226 and the HBL may be provided as one layer.

An EBL may be further formed under the second EML 223. The EBL prevents an electron, injected into the second EML 223, from being transferred to the second HTL 222 and thus enhances a combination of an electron and a hole in the second EML 223, thereby enhancing an emission efficiency of the second EML 223. The second HTL 222 and the EBL may be provided as one layer.

When the second emission part 220 is configured with only a yellow-green EML, the yellow-green EML should realize green and red. Therefore, in order to solve a problem where red efficiency is reduced, one of at least three EMLs may be formed as a red EML. Also, the red EML may be provided closer to the first electrode 202 than the yellow-green EML, and thus, light may be emitted at 610 nm to 640 nm which is a wavelength corresponding to the red EML, thereby further enhancing a color reproduction rate.

And, when the second emission part 220 is configured with a red EML and a yellow-green EML, it is difficult to realize a high color reproduction rate.

A color reproduction rate may be represented by various terms such as a color space, a color area, a color reproduction area, a color reproduction range, or a color gamut. Also, the color reproduction rate may be variously represented depending on requirements of consumers and development of products. In a method of representing the color reproduction rate, sRGB is CIE 1976 standard and may denote a color reproduction rate of each of red (R), green (G), and blue (B). Also, in the method of representing the color reproduction rate, a DCI coverage may be referred to as a DCI color space satisfaction level. Display devices such as televisions (TVs) are required to satisfy a DCI color space expanded by about 130% of the existing sRGB, for displaying a sharper and realistic image. DCI (Digital Cinema Initiatives) may be an RGB color space and may denote a color space which is broader than sRGB. Also, the DCI coverage may denote a range which enables all colors to be displayed, and as the DCI coverage increases, more colors may be displayed. Also, a DCI area ratio may be referred to as an area ratio of a triangle corresponding to a degree to which colors are displayed. As the DCI area ratio increases, an area for displaying each of red (R), green (G), and blue (B) increases, thereby enhancing the color reproduction rate.

Therefore, in the present embodiment, the second emission part 220 may be configured with at least three EMLs emitting different color lights, for enhancing a color reproduction rate. The at least three EMLs may include a red EML, a yellow-green EML, and a green EML. The red EML may be provided for enhancing red efficiency and realizing a high color reproduction rate. Also, a lifetime of the green EML is shortened compared to the yellow-green EML, and for this reason, both the green EML and the yellow-green EML may be provided, thereby enhancing green lifetime. Also, both the green EML and the yellow-green EML may be provided, and thus, by applying the green EML which is phosphorescent, a color reproduction rate is enhanced without any reduction in lifetime. This will be described below with reference to FIGS. 6 to 10.

Therefore, the second EML 223 of the second emission part 220 may be an EML emitting light of a second color. That is, the second EML 223 may be formed a red EML. Also, the third EML 224 may be an EML emitting light of a third color. That is, the third EML 224 may be formed as one of a yellow-green EML and a green EML. Also, the fourth EML 225 may be an EML emitting light of a fourth color. That is, the fourth EML 225 may be formed as one of the yellow-green EML and the green EML.

The red EML which is the second EML 223 may be provided adjacent to the yellow-green EML. Also, the red EML which is the second EML 223 may be provided adjacent to the green EML.

Therefore, the second emission part 220 may include the red EML which is the second EML 223, the yellow-green EML which is the third EML 224, and the green EML which is the fourth EML 225. Alternatively, the second emission part 220 may include the red EML which is the second EML 223, the green EML which is the third EML 224, and the yellow-green EML which is the fourth EML 225. When the second emission part 220 is configured with the green EML which is the fourth EML 225, the yellow-green EML which is the third EML 224, and the red EML which is the second EML 223, in an order of increasing energy band gap in direction to the second electrode 204, a color reproduction rate is similar to but lifetime is more enhanced than a case where the second emission part 220 is configured with the red EML which is the second EML 223, the green EML which is the third EML 224, and the yellow-green EML which is the fourth EML 225. This is because when the green EML which is the fourth EML 225 having a large energy band gap emits light, the yellow-green EML which is the third EML 224 prevents or minimizes a damage of the fourth EML 225, and thus, lifetime is further enhanced.

And, the second emission part 220 may be configured with the second EML 223, the third EML 224 which emits green light based on a phosphorescent material, and the fourth EML 225 configured for enhancing a color reproduction rate and lifetime of the phosphorescent material. The second EML 223 may be the red EML, and the fourth EML 225 may be the yellow-green EML.

Alternatively, the second emission part 220 may be configured with the second EML 223, the fourth EML 225 which emits green light based on a phosphorescent material, and the third EML 224 configured for enhancing a color reproduction rate and lifetime of the phosphorescent material. The second EML 223 may be the red EML, and the third EML 224 may be the yellow-green EML.

And, a peak wavelength ($\lambda$max) of the second EML 223 of the second emission part 220 may be within a range of 625±15 nm. That is, the peak wavelength of the second EML 223 may be within a range of 610 nm to 640 nm. Alternatively, the peak wavelength (λmax) of the second EML 223 may be within a range of 625±8 nm. That is, the peak wavelength of the second EML 223 may be within a range of 617 nm to 633 nm.

When the peak wavelength of the second EML 223 is less than 610 nm, red is displayed as an orange color, causing a considerable reduction in color reproduction rate. Also, when the peak wavelength of the second EML 223 is more than 640 nm, a color reproduction rate is improved, but red efficiency is reduced, causing an increase in power consumption and a reduction in luminance and lifetime. Accordingly, when the peak wavelength of the second EML 223 is a range of 610 nm to 640 nm, power consumption is reduced, and lifetime, luminance, and a color reproduction rate are enhanced.

And, a peak wavelength (λmax) of the third EML 224 of the second emission part 220 may be within a range of 560±10 nm. That is, the peak wavelength of the third EML 224 may be within a range of 550 nm to 570 nm. Alternatively, the peak wavelength (λmax) of the third EML 224 may be within a range of 560±5 nm. That is, the peak wavelength (λmax) of the third EML 224 may be within a range of 555 nm to 565 nm.

When the peak wavelength of the third EML 224 is less than 550 nm, red efficiency is reduced, and for this reason, luminance is reduced and power consumption increases. Also, when the peak wavelength of the third EML 224 is more than 570 nm, red efficiency increases but red is changed to an orange color, and for this reason, a color reproduction rate is reduced and green efficiency is reduced. Accordingly, when the peak wavelength of the third EML 224 is within a range of 550 nm to 570 nm, a color reproduction rate or green efficiency and red efficiency are enhanced.

And, a peak wavelength (λmax) of the fourth EML 225 of the second emission part 220 may be within a range of 530±10 nm. That is, the peak wavelength of the fourth EML 225 may be within a range of 520 nm to 540 nm. Alternatively, the peak wavelength (λmax) of the fourth EML 225 may be within a range of 530±5 nm. That is, the peak wavelength (λmax) of the fourth EML 225 may be within a range of 525 nm to 535 nm.

When the peak wavelength of the fourth EML 225 is less than 520 nm, a color reproduction rate is reduced because blue color coordinates (By) increase, and since efficiency is reduced, power consumption increases and lifetime is shortened. Also, when the peak wavelength of the fourth EML 225 is more than 540 nm, a color reproduction rate and green efficiency are reduced, and for this reason, it is not required to use a green EML. Accordingly, when the peak wavelength of the fourth EML 225 is within a range of 520 nm to 540 nm, green efficiency and lifetime are enhanced.

Here, the third EML 224 may be formed as a green EML, and the fourth EML 225 may be formed as a yellow-green EML. In this case, the peak wavelength of the third EML 224 of the second emission part 220 may be within a range of 520 nm to 540 nm. Also, the peak wavelength of the fourth EML 225 of the second emission part 220 may be within a range of 550 nm to 570 nm.

At least one of the second EML 223, the third EML 224, and the fourth EML 225 may include at least one host and at least one dopant. Alternatively, at least one of the second EML 223, the third EML 224, and the fourth EML 225 may include at least one dopant and a mixed host where two or more hosts are mixed. The mixed host may include a host having hole transport characteristic and a host having electron transport characteristic.

The second EML 223 may include one or more hosts, and examples of the hosts may include 1,3-bis(carbazol-9-yl)benzene (MCP), 4,4'bis(carbozol-9-yl)biphenyl (CBP), 4,4', 4"-tris(carbazol-9-yl)triphenylamine (TcTa), etc. However, the present embodiment is not limited thereto. Also, the second EML 223 may include a dopant, and examples of the dopant may include $Ir(btp)_2(acac)$(bis(2-benzo[b]thiophen-2-yl-pyridine)(acetylacetonate)(iridium)(III)), $Ir(piq)_2(acac)$(bis(1-phenylisoquinoline)(acetylacetonate)iridium(III)), $Ir(piq)_3$(tris(1-phenylisoquinoline)iridium(III)), Rubrene(5,6,11,12-tetraphenylnaphthacene), etc. However, the present embodiment is not limited thereto.

The third EML 224 and the fourth EML 225 may each include one or more hosts, and examples of the hosts may include 4,4'-bis(carbozol-9-yl)biphenyl (CBP), 1,3-bis(carbazol-9-yl)benzene (MCP), etc. However, the present embodiment is not limited thereto. Also, the third EML 224 and the fourth EML 225 may each include a dopant, and examples of the dopant may include $Ir(ppy)_3$(tris(2-phenylpyridine)iridium(III)), $Ir(ppy)_2(acac)$(Bis(2-phenylpyridine)(acetylacetonate)iridium(III)), etc. However, the present embodiment is not limited thereto.

The second HTL 222, the second EML 223, the third EML 224, the fourth EML 225, the second ETL 226, the HIL, the EIL, the HBL, and the EBL may each be referred to as an organic layer.

A first charge generation layer (CGL) 240 may be further provided between the first emission part 210 and the second emission part 220. The first CGL 240 may adjust a charge balance between the first emission part 210 and the second emission part 220.

The first CGL 240 may include an N-type CGL and a P-type CGL. The N-type CGL may inject an electron into the first emission part 210. The N-type CGL may be formed as an organic layer which is doped with alkali metal such as lithium (Li), sodium (Na), potassium (K), or cesium (Cs) or alkali earth metal such as magnesium (Mg), strontium (Sr), barium (Ba), or radium (Ra), but is not limited thereto.

And, the P-type CGL may inject a hole into the second emission part 220. The P-type CGL may be formed as an organic layer including a P-type dopant, but is not limited thereto. Also, the first CGL 240 may be referred to as an organic layer.

The third emission part 230 may include a third HTL 232, a fifth EML 234, and a third ETL 236 which are disposed on the second emission part 220.

Holes supplied through the third HTL 232 and electrons supplied through the third ETL 236 may be recombined in the fifth EML 234 to emit light.

An EIL may be further formed on the third ETL 236. Also, an HIL may be further formed under the third HTL 232.

An HBL may be further formed on the fifth EML 234. The HBL prevents a hole, injected into the fifth EML 234, from being transferred to the third ETL 236 and thus enhances a combination of an electron and a hole in the fifth EML 234, thereby enhancing an emission efficiency of the fifth EML 234. The third ETL 236 and the HBL may be provided as one layer.

An EBL may be further formed under the fifth EML 234. The EBL prevents an electron, injected into the fifth EML 234, from being transferred to the third HTL 232 and thus enhances a combination of an electron and a hole in the fifth EML 234, thereby enhancing an emission efficiency of the fifth EML 234. The third HTL 232 and the EBL may be provided as one layer.

The fifth EML 234 may be an EML emitting light having the same color as the first color. That is, the fifth EML 234 may include one of a blue EML, a deep blue EML, and a sky blue EML.

A peak wavelength of each of the first EML 214 and the fifth EML 234 may be a sum of maximum wavelengths of EL. Therefore, the peak wavelength of each of the first EML 214 and the fifth EML 234 may be within a range of 456±10 nm. That is, the peak wavelength of each of the first EML 214 and the fifth EML 234 may be within a range of 446 nm to 466 nm. Alternatively, the peak wavelength of each of the first EML 214 and the fifth EML 234 may be within a range of 456±5 nm. That is, the peak wavelength of each of the first EML 214 and the fifth EML 234 may be within a range of 451 nm to 461 nm.

In a case where the peak wavelength of each of the first EML 214 and the fifth EML 234 is less than 446 nm, since the blue color coordinates (By) are lowered, a color reproduction rate is easily realized, but lifetime is shortened, efficiency is reduced, and a higher current should be applied to an organic light emitting display device due to a reduction in efficiency, causing an increase in temperature and power consumption of the organic light emitting display device. Also, in a case where the peak wavelength of each of the first EML 214 and the fifth EML 234 is more than 446 nm, since the blue color coordinates (By) is elevated, a color reproduction rate is reduced, and a color temperature of the organic light emitting display device is lowered, causing a reduction in lifetime. Also, a current necessary for blue increases for realizing luminance, and for this reason, a temperature of the organic light emitting display device increases. Accordingly, in a case where the peak wavelength of each of the first EML 214 and the fifth EML 234 is within a range of 446 nm to 466 nm, the temperature of the organic light emitting display device does not increase, power consumption does not increase, and a color reproduction rate is not reduced.

The first EML 214 and the fifth EML 234 may each include at least one host and at least one dopant. Alternatively, the first EML 214 and the fifth EML 234 may each include at least one dopant and a mixed host where two or more hosts are mixed. The mixed host may include a host having hole transport characteristic and a host having electron transport characteristic.

The first EML 214 and the fifth EML 234 may each include one or more hosts, and examples of the hosts may include bis(2-methyl-8-quinolinolate)-4-(phenylphenolato) aluminum (BAlq), 4,4'-bis(2,2-diphenylvinyl)-1,1'-biphenyl (DPVBi), 9,10-di(naphth-2-yl)anthracene (ADN), etc. However, the present embodiment is not limited thereto. Also, the first EML 214 and the fifth EML 234 may each include a dopant, and examples of the dopant may include perylene group, bis(3,5-difluoro-2-(2-pyridyl)phenyl-(2-carboxypyridyl)iridium(III) (FIrPic), anthanthrene group, etc. However, the present embodiment is not limited thereto.

And, thicknesses of the first EML 214 and the fifth EML 234 may be differently adjusted. For example, in a case where the thickness of each of the first EML 214 and the fifth EML 234 is adjusted to 10 nm to 30 nm, the thickness of the first EML 214 may be adjusted to 10 nm, and the thickness of the fifth EML 234 may be adjusted to 30 nm.

The third HTL 232, the fifth EML 234, the third ETL 236, the EIL, the HIL, the HBL, and the EBL which configure the third emission part 230 may each be referred to as an organic layer.

A second CGL 250 may be further provided between the second emission part 220 and the third emission part 230. The second CGL 250 may adjust a charge balance between the second emission part 220 and the third emission part 230.

The second CGL 250 may include an N-type CGL and a P-type CGL. The N-type CGL may inject an electron into the second emission part 220, and the P-type CGL may inject a hole into the third emission part 230.

The N-type CGL may be formed as an organic layer which is doped with alkali metal such as lithium (Li), sodium (Na), potassium (K), or cesium (Cs) or alkali earth metal such as magnesium (Mg), strontium (Sr), barium (Ba), or radium (Ra), but is not limited thereto. The P-type CGL may be formed as an organic layer including a P-type dopant, but is not limited thereto. Also, the second CGL 250 may be referred to as an organic layer.

In the organic light emitting device according to the second embodiment of the present disclosure, at least one of the first to third emission parts may include at least three EMLs emitting lights of different colors, and one of the at least three EMLs may include a green EML formed of a phosphorescent material. Also, the at least three EMLs may further include a red EML and a yellow-green EML. Also, two emission parts including EMLs emitting lights of the same color may include the first emission part and the third emission part. Accordingly, a peak wavelength of each of lights emitted from at least two emission parts may be within a range of 456±10 nm, 530±10 nm, 560±10 nm, and 625±15 nm.

And, in the organic light emitting display device including the organic light emitting device according to the second embodiment of the present disclosure, a pixel area may be defined by a gate line and a data line on the substrate 201. A power line which extends in parallel with one of the gate line and the data line may be disposed on the substrate 201, and a switching TFT connected to the gate line or the data line and a driving TFT connected to the switching TFT may be disposed in the pixel area. The driving TFT may be connected to the first electrode 202.

And, in addition to the second emission part, the first emission part or the third emission part including at least three EMLs emitting lights of different colors will be described below with reference to FIGS. 4 and 5.

Figure 4:
FIG. 4 is a diagram illustrating an organic light emitting device according to a third embodiment of the present disclosure.

FIG. 4 is a diagram illustrating an organic light emitting device 300 according to a third embodiment of the present disclosure.

The organic light emitting device 300 according to the third embodiment of the present disclosure illustrated in FIG. 4 may include a substrate 301, a first electrode 302, a second electrode 304, and first to third emission parts 310 to 330 between the first and second electrodes 302 and 304.

The substrate 301, the first electrode 302, the second electrode 304, and the third emission part 330 of FIG. 4 are substantially the same as the substrate 201, the first electrode 202, the second electrode 204, and the third emission part 230 described above with reference to FIG. 3, and thus, their detailed descriptions are omitted.

The first emission part 310 may include a first HTL 312, a first EML 313, a second EML 314, a third EML 315, and a first ETL 316 which are disposed on the first electrode 302.

An HIL may be further formed on the first electrode 302.

The first HTL 312 may be formed of two or more layers or two or more materials.

The first HTL 312 may supply a hole, supplied from the first electrode 302 or the HIL, to the first to third EMLs 313 to 315. The first ETL 316 may supply an electron, supplied from the second electrode 304, to the first to third EMLs 313 to 315. Therefore, holes supplied through the first HTL 312 and electrons supplied through the first ETL 216 may be recombined in the first to third EMLs 313 to 315, thereby emitting light.

An EIL may be further formed on the first ETL 316.

An HBL may be further formed on the third EML 315. The first ETL 316 and the HBL may be provided as one layer.

An EBL may be further formed under the first EML 313. The first HTL 312 and the EBL may be provided as one layer.

The first EML 313 of the first emission part 310 may be an EML emitting light of a first color. That is, the first EML 313 may be formed as a red EML. Also, the second EML 314 may be an EML emitting light of a second color. That is, the second EML 314 may be formed as one of a yellow-green EML and a green EML. Also, the third EML 315 may be an EML emitting light of a third color. That is, the third EML 315 may be formed as one of the yellow-green EML and the green EML.

The red EML which is the first EML 313 may be provided adjacent to the yellow-green EML. Also, the red EML which is the first EML 313 may be provided adjacent to the green EML.

Therefore, the first emission part 310 may include the red EML which is the first EML 313, the yellow-green EML which is the second EML 314, and the green EML which is the third EML 315. Alternatively, the first emission part 310 may include the red EML which is the first EML 313, the green EML which is the second EML 314, and the yellow-green EML which is the third EML 315. When the first emission part 310 is configured with the green EML which is the third EML 315, the yellow-green EML which is the second EML 314, and the red EML which is the first EML 313, in descending order of energy band gaps with respect to the second electrode 304, a color reproduction rate is similar to but lifetime is more enhanced than a case where the first emission part 310 is configured with the red EML which is the first EML 313, the green EML which is the second EML 314, and the yellow-green EML which is the third EML 315. This is because when the green EML which is the third EML 315 having a large energy band gap emits light, the yellow-green EML which is the second EML 314 prevents or minimizes a damage of the third EML 315, and thus, lifetime is further enhanced.

And, the first emission part 310 may be configured with the first EML 313, the second EML 314 which emits green light based on a phosphorescent material, and the third EML 315 configured for enhancing a color reproduction rate and lifetime of the phosphorescent material. The first EML 313 may be the red EML, and the third EML 315 may be the yellow-green EML.

Alternatively, the first emission part 310 may be configured with the first EML 313, the third EML 315 which emits green light based on a phosphorescent material, and the second EML 314 configured for enhancing a color reproduction rate and lifetime of the phosphorescent material. The first EML 313 may be the red EML, and the second EML 314 may be the yellow-green EML.

And, a peak wavelength (λmax) of the first EML 313 of the first emission part 310 may be within a range of 625±15 nm. That is, the peak wavelength of the first EML 313 may be within a range of 610 nm to 640 nm. Alternatively, the peak wavelength (λmax) of the first EML 313 may be within a range of 625±8 nm. That is, the peak wavelength of the first EML 313 may be within a range of 617 nm to 633 nm.

When the peak wavelength of the first EML 313 is less than 610 nm, red is displayed as an orange color, causing a considerable reduction in color reproduction rate. Also, when the peak wavelength of the first EML 313 is more than 640 nm, a color reproduction rate is improved, but red efficiency is reduced, causing an increase in power consumption and a reduction in luminance and lifetime. Accordingly, when the peak wavelength of the first EML 313 is a range of 610 nm to 640 nm, power consumption is reduced, and lifetime, luminance, and a color reproduction rate are enhanced.

And, a peak wavelength (λmax) of the second EML 314 of the first emission part 310 may be within a range of 560±10 nm. That is, the peak wavelength of the second EML 314 may be within a range of 550 nm to 570 nm. Alternatively, the peak wavelength (λmax) of the second EML 314 may be within a range of 560±5 nm. That is, the peak wavelength (λmax) of the second EML 314 may be within a range of 555 nm to 565 nm.

When the peak wavelength of the second EML 314 is less than 550 nm, red efficiency is reduced, and for this reason, luminance is reduced and power consumption increases. Also, when the peak wavelength of the second EML 314 is more than 570 nm, red efficiency increases but red is changed to an orange color, and for this reason, a color reproduction rate is reduced and green efficiency is reduced. Accordingly, when the peak wavelength of the second EML 314 is within a range of 550 nm to 570 nm, a color reproduction rate or green efficiency and red efficiency are enhanced.

And, a peak wavelength (λmax) of the third EML 315 of the first emission part 310 may be within a range of 530±10 nm. That is, the peak wavelength of the third EML 315 may be within a range of 520 nm to 540 nm. Alternatively, the peak wavelength (λmax) of the third EML 315 may be within a range of 530±5 nm. That is, the peak wavelength (λmax) of the third EML 315 may be within a range of 525 nm to 535 nm.

When the peak wavelength of the third EML 315 is less than 520 nm, a color reproduction rate is reduced because blue color coordinates (By) increase, and since efficiency is reduced, power consumption increases and lifetime is shortened. Also, when the peak wavelength of the third EML 315 is more than 540 nm, a color reproduction rate and green efficiency are reduced, and for this reason, it is not required to use a green EML. Accordingly, when the peak wavelength of the third EML 315 is within a range of 520 nm to 540 nm, green efficiency and lifetime are enhanced.

Here, the second EML 314 may be formed as a green EML, and the third EML 315 may be formed as a yellow-green EML. In this case, the peak wavelength of the second EML 314 of the first emission part 310 may be within a range of 520 nm to 540 nm. Also, the peak wavelength of the third EML 315 of the first emission part 310 may be within a range of 550 nm to 570 nm.

At least one of the first EML 313, the second EML 314, and the third EML 315 may include at least one host and at least one dopant. Alternatively, at least one of the first EML 313, the second EML 314, and the third EML 315 may include at least one dopant and a mixed host where two or more hosts are mixed. The mixed host may include a host having hole transport characteristic and a host having electron transport characteristic.

The host or the dopant included in the first EML 313, the second EML 314, and the third EML 315 are the same as that included in the second EML 223, the third EML 224, and the fourth EML 225 described above with reference to FIG. 3, and thus, its detailed description is omitted.

The first HTL 312, the first EML 313, the second EML 314, the third EML 315, the second ETL 316, the HIL, the EIL, the HBL, and the EBL may each be referred to as an organic layer.

The second emission part 320 may include a second HTL 322, a fourth EML 324, and a second ETL 326 which are disposed on the first emission part 310.

An EIL may be further formed on the second ETL 326. Also, an HIL may be further formed under the second HTL 322.

An HBL may be further formed on the fourth EML 324. The second ETL 326 and the HBL may be provided as one layer.

An EBL may be further formed under the fourth EML 324. The second HTL 322 and the EBL may be provided as one layer.

The fourth EML 324 may be an EML emitting light of a fourth color. That is, the fourth EML 324 may include one of a blue EML, a deep blue EML, and a sky blue EML.

The fourth EML 324 may include at least one host and at least one dopant. Alternatively, the fourth EML 324 may include at least one dopant and a mixed host where two or more hosts are mixed. The mixed host may include a host having hole transport characteristic and a host having electron transport characteristic.

The second HTL 322, the fourth EML 324, the second ETL 326, the HIL, the EIL, the HBL, and the EBL may each be referred to as an organic layer.

A first CGL 340 may be further provided between the first emission part 310 and the second emission part 320. The first CGL 340 may adjust a charge balance between the first emission part 310 and the second emission part 320.

The first CGL 340 may include an N-type CGL and a P-type CGL. The N-type CGL may inject an electron into the first emission part 310. The P-type CGL may inject a hole into the second emission part 320.

The third emission part 330 may include a third HTL 332, a fifth EML 334, and a third ETL 336 which are disposed on the second emission part 320. Description on the third emission part 330 is the same as the third emission part 230 described above with reference to FIG. 3, and thus, the fifth EML 334 will be described below.

The fifth EML 334 may be an EML emitting light having the same color as the fourth color. That is, the fifth EML 334 may include one of a blue EML, a deep blue EML, and a sky blue EML.

A peak wavelength of each of the fourth EML 324 and the fifth EML 334 may be a sum of maximum wavelengths of EL. Therefore, the peak wavelength of each of the fourth EML 324 and the fifth EML 334 may be within a range of 456±10 nm. That is, the peak wavelength of each of the fourth EML 324 and the fifth EML 334 may be within a range of 446 nm to 466 nm. Alternatively, the peak wavelength of each of the fourth EML 324 and the fifth EML 334 may be within a range of 456±5 nm. That is, the peak wavelength of each of the fourth EML 324 and the fifth EML 334 may be within a range of 451 nm to 461 nm.

In a case where the peak wavelength of each of the fourth EML 324 and the fifth EML 334 is less than 446 nm, since the blue color coordinates (By) are lowered, a color reproduction rate is easily realized, but lifetime is shortened, efficiency is reduced, and a higher current should be applied to an organic light emitting display device due to a reduction in efficiency, causing an increase in temperature and power consumption of the organic light emitting display device. Also, in a case where the peak wavelength of each of the fourth EML 324 and the fifth EML 334 is more than 446 nm, since the blue color coordinates (By) is elevated, a color reproduction rate is reduced, and a color temperature of the organic light emitting display device is lowered, causing a reduction in lifetime. Also, a current necessary for blue increases for realizing luminance, and for this reason, a temperature of the organic light emitting display device increases. Accordingly, in a case where the peak wavelength of each of the fourth EML 324 and the fifth EML 334 is within a range of 446 nm to 466 nm, the temperature of the organic light emitting display device does not increase, power consumption does not increase, and a color reproduction rate is not reduced.

The fourth EML 324 and the fifth EML 334 may each include at least one host and at least one dopant. Alternatively, the fourth EML 324 and the fifth EML 334 may each include at least one dopant and a mixed host where two or more hosts are mixed. The mixed host may include a host having hole transport characteristic and a host having electron transport characteristic.

The fourth EML 324 and the fifth EML 334 may each include one or more hosts, and examples of the hosts may include bis(2-methyl-8-quinolinolate)-4-(phenylphenolato)aluminum (BAlq), 4,4'-bis(2,2-diphenylvinyl)-1,1'-biphenyl (DPVBi), 9,10-di(naphth-2-yl)anthracene (ADN), etc. However, the present embodiment is not limited thereto. Also, the fourth EML 324 and the fifth EML 334 may each include a dopant, and examples of the dopant may include perylene group, bis(3,5-difluoro-2-(2-pyridyl)phenyl-(2-carboxypyridyl)iridium(III) (FIrPic), anthanthrene group, etc. However, the present embodiment is not limited thereto.

And, thicknesses of the fourth EML 324 and the fifth EML 334 may be differently adjusted. For example, in a case where the thickness of each of the fourth EML 324 and the fifth EML 334 is adjusted to 10 nm to 30 nm, the thickness of the fourth EML 324 may be adjusted to 10 nm, and the thickness of the fifth EML 334 may be adjusted to 30 nm.

A second CGL 350 may be further provided between the second emission part 320 and the third emission part 330. The second CGL 350 may adjust a charge balance between the second emission part 320 and the third emission part 330.

The second CGL 350 may include an N-type CGL and a P-type CGL. The N-type CGL may inject an electron into the second emission part 320, and the P-type CGL may inject a hole into the third emission part 330.

In the organic light emitting device according to the third embodiment of the present disclosure, at least one of the first to third emission parts may include at least three EMLs emitting lights of different colors, and one of the at least three EMLs may include a green EML formed of a phosphorescent material. Also, the at least three EMLs may further include a red EML and a yellow-green EML. Also, two emission parts including EMLs emitting lights of the same color may include the second emission part and the third emission part. Accordingly, a peak wavelength of each of lights emitted from at least two emission parts may be within a range of 456±10 nm, 530±10 nm, 560±10 nm, and 625±15 nm.

And, in the organic light emitting display device including the organic light emitting device according to the third embodiment of the present disclosure, a pixel area may be defined by a gate line and a data line on the substrate 301. A power line which extends in parallel with one of the gate line and the data line may be disposed on the substrate 301, and a switching TFT connected to the gate line or the data line and a driving TFT connected to the switching TFT may be disposed in the pixel area. The driving TFT may be connected to the first electrode 302.

Figure 5:
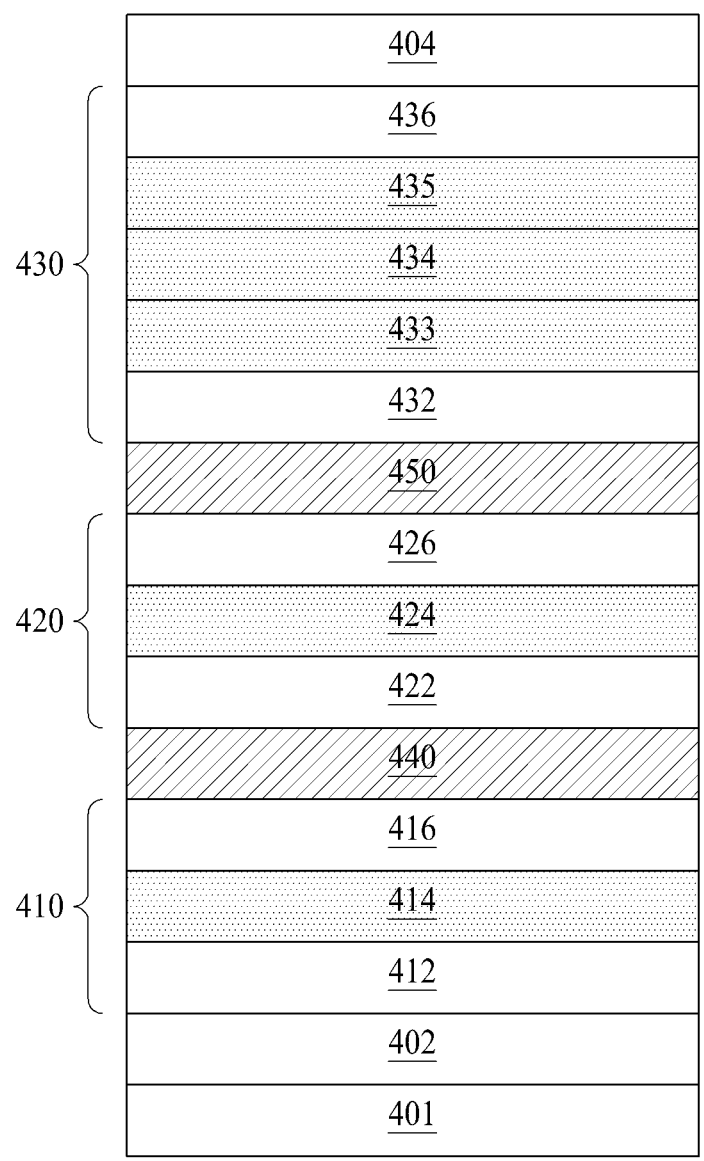
FIG. 5 is a diagram illustrating an organic light emitting device according to a fourth embodiment of the present disclosure.

FIG. 5 is a diagram illustrating an organic light emitting device 400 according to a fourth embodiment of the present disclosure.

The organic light emitting device 400 according to the fourth embodiment of the present disclosure illustrated in FIG. 5 may include a substrate 401, a first electrode 402, a second electrode 404, and first to third emission parts 410 to 430 between the first and second electrodes 402 and 404.

The substrate 401, the first electrode 402, the second electrode 404, and the first emission part 410 of FIG. 5 are substantially the same as the substrate 201, the first electrode 202, the second electrode 204, and the first emission part 210 described above with reference to FIG. 3, and thus, their detailed descriptions are omitted.

The first emission part 410 may include a first HTL 412, a first EML 414, and a first ETL 416 which are disposed on the first electrode 402. Description on the first emission part 410 is substantially the same as the first emission part 210 described above with reference to FIG. 3, and thus, the first EML 414 will be described below.

The first EML 414 of the first emission part 410 may be an EML emitting light of a first color. That is, the first EML 414 may include one of a blue EML, a deep blue EML, and a sky blue EML.

The second emission part 420 may include a second HTL 422, a second EML 424, and a second ETL 426 which are disposed on the first emission part 410.

An EIL may be further formed on the second ETL 426. Also, an HIL may be further formed under the second HTL 422.

An HBL may be further formed on the fourth EML 424. The second ETL 426 and the HBL may be provided as one layer.

An EBL may be further formed under the fourth EML 424. The second HTL 422 and the EBL may be provided as one layer.

The second EML 424 may be an EML emitting light of the same color as the first color. That is, the second EML 424 may include one of a blue EML, a deep blue EML, and a sky blue EML.

A peak wavelength of each of the first EML 414 and the second EML 424 may be a sum of maximum wavelengths of EL. Therefore, the peak wavelength of each of the first EML 414 and the second EML 424 may be within a range of 456±10 nm. That is, the peak wavelength of each of the first EML 414 and the second EML 424 may be within a range of 446 nm to 466 nm. Alternatively, the peak wavelength of each of the first EML 414 and the second EML 424 may be within a range of 456±5 nm. That is, the peak wavelength of each of the first EML 414 and the second EML 424 may be within a range of 451 nm to 461 nm.

In a case where the peak wavelength of each of the first EML 414 and the second EML 424 is less than 446 nm, since the blue color coordinates (By) are lowered, a color reproduction rate is easily realized, but lifetime is shortened, efficiency is reduced, and a higher current should be applied to an organic light emitting display device due to a reduction in efficiency, causing an increase in temperature and power consumption of the organic light emitting display device. Also, in a case where the peak wavelength of each of the first EML 414 and the second EML 424 is more than 446 nm, since the blue color coordinates (By) is elevated, a color reproduction rate is reduced, and a color temperature of the organic light emitting display device is lowered, causing a reduction in lifetime. Also, a current necessary for blue increases for realizing luminance, and for this reason, a temperature of the organic light emitting display device increases. Accordingly, in a case where the peak wavelength of each of the first EML 414 and the second EML 424 is within a range of 446 nm to 466 nm, the temperature of the organic light emitting display device does not increase, power consumption does not increase, and a color reproduction rate is not reduced.

The first EML 414 and the second EML 424 may each include at least one host and at least one dopant. Alternatively, the first EML 414 and the second EML 424 may each include at least one dopant and a mixed host where two or more hosts are mixed. The mixed host may include a host having hole transport characteristic and a host having electron transport characteristic.

The first EML 414 and the second EML 424 may each include one or more hosts, and examples of the hosts may include bis(2-methyl-8-quinolinolate)-4-(phenylphenolato) aluminum (BAlq), 4,4'-bis(2,2-diphenylvinyl)-1,1'-biphenyl (DPVBi), 9,10-di(naphth-2-yl)anthracene (ADN), etc. However, the present embodiment is not limited thereto. Also, the first EML 414 and the second EML 424 may each include a dopant, and examples of the dopant may include perylene group, bis(3,5-difluoro-2-(2-pyridyl)phenyl-(2-carboxypyridyl)iridium(III) (FlrPic), anthanthrene group, etc. However, the present embodiment is not limited thereto.

And, thicknesses of the first EML 414 and the second EML 424 may be differently adjusted. For example, in a case where the thickness of each of the first EML 414 and the second EML 424 is adjusted to 10 nm to 30 nm, the thickness of the first EML 414 may be adjusted to 10 nm, and the thickness of the second EML 424 may be adjusted to 30 nm.

The first HTL 412, the second HTL 422, the first EML 414, the second EML 424, the first ETL 416, the second ETL 426, the HIL, the EIL, the HBL, and the EBL may each be referred to as an organic layer.

A first CGL 440 may be further provided between the first emission part 410 and the second emission part 440. The first CGL 440 may adjust a charge balance between the first emission part 410 and the second emission part 440.

The first CGL 440 may include an N-type CGL and a P-type CGL. The N-type CGL may inject an electron into the first emission part 410, and the P-type CGL may inject a hole into the second emission part 420.

The third emission part 430 may include a third HTL 432, a third EML 433, a fourth EML 434, a fifth EML 435, and a third ETL 436 which are disposed on the second emission part 420.

An EIL may be further formed on the third ETL 436. Also, an HIL may be further formed under the third HTL 432.

An HBL may be further formed on the fifth EML 435. The third ETL 436 and the HBL may be provided as one layer.

An EBL may be further formed under the third EML 433. The third HTL 432 and the EBL may be provided as one layer.

The third EML 433 of the third emission part 430 may be an EML emitting light of a second color. That is, the third EML 433 may be formed as a red EML. Also, the fourth EML 434 may be an EML emitting light of a third color. That is, the fourth EML 434 may be formed as one of a yellow-green EML and a green EML. Also, the fifth EML 435 may be an EML emitting light of a fourth color. That is, the fifth EML 435 may be formed as one of the yellow-green EML and the green EML.

The red EML which is the third EML 433 may be provided adjacent to the yellow-green EML. Also, the red EML which is the third EML 433 may be provided adjacent to the green EML.

Therefore, the third emission part 430 may include the red EML which is the third EML 433, the yellow-green EML which is the fourth EML 434, and the green EML which is the fifth EML 435. Alternatively, the third emission part 430 may include the red EML which is the third EML 433, the green EML which is the fourth EML 434, and the yellow-green EML which is the fifth EML 435. When the third emission part 430 is configured with the green EML which is the fifth EML 435, the yellow-green EML which is the fourth EML 434, and the red EML which is the third EML 433, in descending order of energy band gap with respect to the second electrode 404, a color reproduction rate is similar to but lifetime is more enhanced than a case where the third emission part 430 is configured with the red EML which is the third EML 433, the green EML which is the fourth EML 434, and the yellow-green EML which is the fifth EML 435. This is because when the green EML which is the fifth EML 435 having a large energy band gap emits light, the yellow-green EML which is the fourth EML 434 prevents or minimizes a damage of the fifth EML 435, and thus, lifetime is further enhanced.

And, the third emission part 430 may be configured with the third EML 433, the fourth EML 434 which is formed of a phosphorescent material for emitting green light, and the fifth EML 435 configured for enhancing a color reproduction rate and lifetime of the phosphorescent material. The third EML 433 may be the red EML, and the fifth EML 435 may be the yellow-green EML.

Alternatively, the third emission part 430 may be configured with the third EML 433, the fifth EML 435 which is formed of a phosphorescent material for emitting green light, and the fourth EML 434 configured for enhancing a color reproduction rate and lifetime of the phosphorescent material. The third EML 433 may be the red EML, and the fourth EML 434 may be the yellow-green EML.

And, a peak wavelength ($\lambda$max) of the third EML 433 of the third emission part 430 may be within a range of 625±15 nm. That is, the peak wavelength of the third EML 433 may be within a range of 610 nm to 640 nm. Alternatively, the peak wavelength ($\lambda$max) of the third EML 433 may be within a range of 625±8 nm.

That is, the peak wavelength of the third EML 433 may be within a range of 617 nm to 633 nm.

When the peak wavelength of the third EML 433 is less than 610 nm, red is displayed as an orange color, causing a considerable reduction in color reproduction rate. Also, when the peak wavelength of the third EML 433 is more than 640 nm, a color reproduction rate is improved, but red efficiency is reduced, causing an increase in power consumption and a reduction in luminance and lifetime. Accordingly, when the peak wavelength of the third EML 433 is a range of 610 nm to 640 nm, lifetime, luminance, and a color reproduction rate are enhanced.

Moreover, a peak wavelength ($\lambda$max) of the fourth EML 434 of the third emission part 430 may be within a range of 560±10 nm. That is, the peak wavelength of the fourth EML 434 may be within a range of 550 nm to 570 nm. Alternatively, the peak wavelength ($\lambda$max) of the fourth EML 434 may be within a range of 560±5 nm. That is, the peak wavelength ($\lambda$max) of the fourth EML 434 may be within a range of 555 nm to 565 nm.

When the peak wavelength of the fourth EML 434 is less than 550 nm, red efficiency is reduced, and for this reason, luminance is reduced and power consumption increases. Also, when the peak wavelength of the fourth EML 434 is more than 570 nm, red efficiency increases but red is changed to an orange color, and for this reason, a color reproduction rate is reduced and green efficiency is reduced. Accordingly, when the peak wavelength of the fourth EML 434 is within a range of 550 nm to 570 nm, a color reproduction rate or green efficiency and red efficiency are enhanced.

And, a peak wavelength ($\lambda$max) of the fifth EML 435 of the third emission part 430 may be within a range of 530±10 nm. That is, the peak wavelength of the fifth EML 435 may be within a range of 520 nm to 540 nm. Alternatively, the peak wavelength ($\lambda$max) of the fifth EML 435 may be within a range of 530±5 nm. That is, the peak wavelength ($\lambda$max) of the fifth EML 435 may be within a range of 525 nm to 535 nm.

When the peak wavelength of the fifth EML 435 is less than 520 nm, a color reproduction rate is reduced because blue color coordinates (By) is elevated, and since efficiency is reduced, power consumption increases and lifetime is shortened. Also, when the peak wavelength of the fifth EML 435 is more than 540 nm, a color reproduction rate and green efficiency are reduced, and for this reason, it is not required to use a green EML. Accordingly, when the peak wavelength of the fifth EML 435 is within a range of 520 nm to 540 nm, green efficiency and lifetime are enhanced.

Here, the fourth EML 434 may be formed as a green EML, and the fifth EML 435 may be formed as a yellow-green EML. In this case, the peak wavelength of the fourth EML 434 of the third emission part 430 may be within a range of 520 nm to 540 nm. Also, the peak wavelength of the fifth EML 435 of the third emission part 430 may be within a range of 550 nm to 570 nm.

At least one of the third EML 433, the fourth EML 434, and the fifth EML 435 may include at least one host and at least one dopant. Alternatively, at least one of the third EML 433, the fourth EML 434, and the fifth EML 435 may include at least one dopant and a mixed host where two or more hosts are mixed. The mixed host may include a host having hole transport characteristic and a host having electron transport characteristic.

The host or the dopant included in the third EML 433, the fourth EML 434, and the fifth EML 435 are the same as that included in the second EML 223, the third EML 224, and the fourth EML 225 described above with reference to FIG. 3, and thus, its detailed description is omitted.

The third HTL 432, the third EML 433, the fourth EML 434, the fifth EML 435, the third ETL 436, the EIL, the HIL, the HBL, and the EBL may each be referred to as an organic layer.

A second CGL 450 may be formed between the second emission part 420 and the third emission part 430. The second CGL 450 may adjust a charge balance between the second emission part 420 and the third emission part 430.

The second CGL 450 may include an N-type CGL and a P-type CGL. The N-type CGL may inject an electron into the second emission part 420, and the P-type CGL may inject a hole into the third emission part 430.

In the organic light emitting device according to the fourth embodiment of the present disclosure, at least one of the first to third emission parts may include at least three EMLs emitting lights of different colors, and one of the at least three EMLs may include a green EML formed of a phosphorescent material. Also, the at least three EMLs may further include a red EML and a yellow-green EML. Also, two emission parts including EMLs emitting lights of the same color may include the first emission part and the second emission part. Accordingly, a peak wavelength of each of lights emitted from at least two emission parts may be within a range of 456±10 nm, 530±10 nm, 560±10 nm, and 625±15 nm.

Moreover, in the organic light emitting display device including the organic light emitting device according to the fourth embodiment of the present disclosure, a pixel area may be defined by a gate line and a data line on the substrate 401. A power line which extends in parallel with one of the gate line and the data line may be disposed on the substrate 401, and a switching TFT connected to the gate line or the data line and a driving TFT connected to the switching TFT may be disposed in the pixel area. The driving TFT may be connected to the first electrode 402.

Moreover, the organic light emitting display device according to the embodiments of the present disclosure may be applied to televisions (TVs), mobile terminals, tablet personal computers (PCs), monitors, notebook computers, laptop computers, display devices for vehicles, etc.

The following Table 1 shows results obtained by measuring external quantum efficiency (EQE), a peak voltage, a DCI area ratio, and a DCI coverage in the first embodiment of the present disclosure and the second embodiment of the present disclosure. The external quantum efficiency (EQE) and the peak voltage have been measured under a condition where a current density is 10 mA/cm$^2$.

TABLE 1

|  |  | First Embodiment | Second Embodiment |
|---|---|---|---|
| External Quantum Efficiency (%) |  | 34.7% | 35.7% |
| Peak Voltage (V) |  | 13.8 V | 13.3 V |
| DCI | Area Ratio (%) | 92.0% | 104.8% |
|  | Coverage (%) | 90.6% | 99.3% |

The external quantum efficiency (EQE) denotes emission efficiency of when light is output to outside the organic light emitting device. To describe the external quantum efficiency (EQE), it can be seen that in the external quantum efficiency (EQE), the first embodiment of the present disclosure is 34.7%, and the second embodiment of the present disclosure is 35.7%. Therefore, it can be seen that in the emission efficiency, the first embodiment of the present disclosure is more enhanced than the second embodiment of the present disclosure.

The peak voltage denotes a voltage applied to a pixel when peak efficiency is realized in the organic light emitting display device. To describe the peak voltage, it can be seen that in the peak voltage, the first embodiment is 13.8 V, and the second embodiment is 13.3 V. Therefore, it can be seen that in the peak voltage, the second embodiment of the present disclosure is reduced by about 0.5 V in comparison with the first embodiment of the present disclosure. This denotes that in a driving voltage, the second embodiment of the present disclosure to which a yellow-green EML and a green EML are applied is more reduced than the first embodiment of the present disclosure to which the yellow-green EML is applied. That is, it can be seen that since the green EML is provided along with the yellow-green EML applied to the second embodiment of the present disclosure, green lifetime is enhanced, and thus, the driving voltage is reduced.

The color reproduction rate may be referred to as a color space, a color area, a color reproduction area, a color reproduction range, or a color gamut. Also, depending on requirements of consumers and development of products, the color reproduction rate may be changed in range and may be used as various terms. A DCI area ratio may denote an area ratio of a triangle corresponding to a degree to which colors are displayed. As the DCI area ratio increases, an area for displaying each of red (R), green (G), and blue (B) increases, thereby enhancing the color reproduction rate. Also, the DCI coverage may denote a range which enables all colors to be displayed, and as the DCI coverage increases, more colors may be displayed, thereby enhancing the color reproduction rate.

As shown in Table 1, it can be seen that in comparison with the first embodiment of the present disclosure, the DCI area ratio of the second embodiment of the present disclosure is 104.8% and is more than 100%. Accordingly, since the DCI area ratio is more than 100%, it can be seen that the second embodiment of the present disclosure realizes a color close to a natural color, and thus, the color reproduction rate is enhanced.

And, it can be seen that in comparison with the first embodiment of the present disclosure, the DCI coverage of the second embodiment of the present disclosure is 99.3% and is approximately close to 100%. Accordingly, since the DCI coverage is close to 100%, it can be seen that the second embodiment of the present disclosure realizes more colors, and thus, the color reproduction rate is enhanced.

Table 1 shows a result obtained by measuring the second embodiment of the present disclosure, but results which are the same as the details described above with reference to Table 1 may be obtained by measuring the third embodiment of the present disclosure and the fourth embodiment of the present disclosure.

Figure 6:
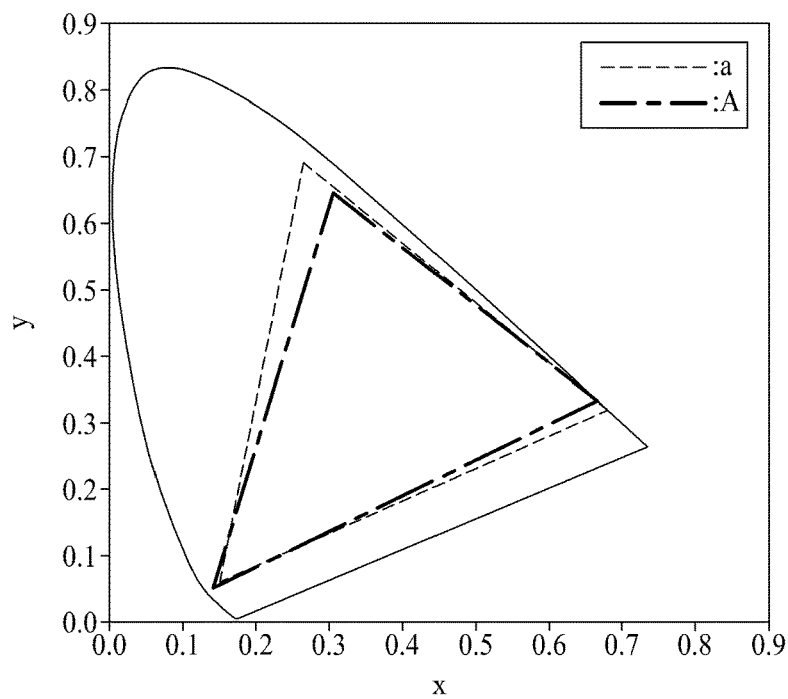
FIG. 6 is a diagram showing a color reproduction rate according to a first embodiment of the present disclosure.
Figure 7:
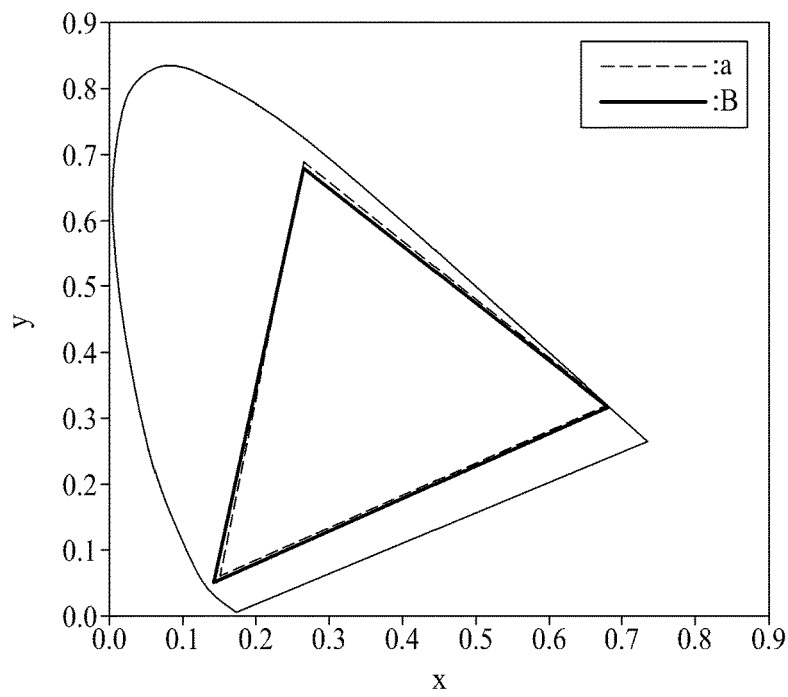
FIG. 7 is a diagram showing a color reproduction rate according to a second embodiment of the present disclosure.

FIG. 6 is a diagram showing a color reproduction rate according to a first embodiment of the present disclosure, and FIG. 7 is a diagram showing a color reproduction rate according to a second embodiment of the present disclosure.

In FIGS. 6 and 7, the abscissa axis indicates x color coordinates, and the ordinate axis indicates y color coordinates.

In FIGS. 6 and 7, a solid line indicates a CIE 1931 XY chromaticity diagram, and a dotted line indicates a DCI of the CIE 1931 XY chromaticity diagram. RGB color coordinates of the DCI are Rx, Ry(0.68, 0.32), Gx, Gy(0.265, 0.690), Bx, and By(0.150, 0.060).

In FIG. 6, a indicates the DCI, and A indicates the first embodiment.

As shown in FIG. 6, it can be seen that the first embodiment shows an area narrower than the DCI. That is, in the first embodiment, it can be seen that in comparison with the DCI, a DCI of green is reduced, and moreover, a DCI of red is reduced.

In FIG. 7, a indicates the DCI, and B indicates the second embodiment of the present disclosure.

As shown in FIG. 7, it can be seen that the second embodiment of the present disclosure shows an area close to the DCI. That is, in comparison with the first embodiment, it can be seen that in the second embodiment, a DCI of green increases, and moreover, a DCI of red increases. Therefore, in the second embodiment of the present disclosure, since the DCI increases, more colors can be realized. That is, it can be seen that at least one of first to third emission parts includes at least three EMLs emitting lights of different colors, and the at least three EMLs includes a green EML including a phosphorescent material, thereby enhancing the color reproduction rate.

Figure 8:
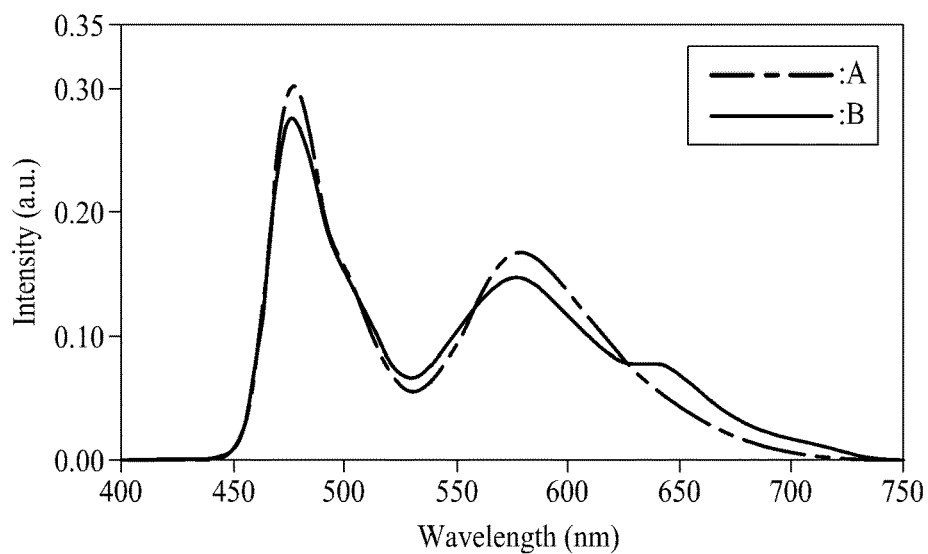
FIG. 8 is a diagram showing an electroluminescent (EL) spectrum according to a first embodiment of the present disclosure and a second embodiment of the present disclosure.

FIG. 8 is a diagram showing an electroluminescent (EL) spectrum according to the first embodiment of the present disclosure and the second embodiment of the present disclosure.

In FIG. 8, the abscissa axis indicates a wavelength range (nm) of light, and the ordinate axis indicates emission intensity (arbitrary unit; a.u.). The emission intensity is a numerical value expressed as a relative value with respect to a maximum value of the EL spectrum. The emission intensity is represented by performing an arithmetic operation on a value of a yellow-green EL spectrum and a value of a red EL spectrum, based on 0.30 (a.u.) which is a value of a blue EL spectrum and is a maximum value. In FIG. 8, A indicates the first embodiment of the present disclosure, and B indicates the second embodiment of the present disclosure.

As shown in FIG. 8, in the first embodiment, it can be seen that a peak is shown at 440 nm to 480 nm which is a wavelength corresponding to a blue area, and a peak is shown at 540 nm to 580 nm which is a wavelength corresponding to a yellow-green area.

Moreover, in the second embodiment of the present disclosure, it can be seen that a peak is shown at 446 nm to 466 nm which is a wavelength corresponding to the blue area. Also, it can be seen that a peak wavelength is shown at 520 nm to 570 nm. It can be seen that 520 nm to 540 nm is a wavelength corresponding to a green area and 550 nm to 570 nm is a wavelength corresponding to the yellow-green area. A green EML is provided in the second embodiment of the present disclosure, and thus, in comparison with the first embodiment, it can be seen that in the second embodiment, a peak moves a little to a short wavelength. Also, the red EML is provided in the second embodiment of the present disclosure, and thus, it can be seen that in the second embodiment, a peak is shown at a wavelength of 610 nm to 640 nm. Therefore, in the second embodiment of the present disclosure, at least four peak wavelengths are shown, and peaks are shown at wavelengths of 446 nm to 466 nm, 520 nm to 540 nm, 550 nm to 570 nm, and 610 nm to 640 nm. Here, a peak wavelength denotes a maximum wavelength of EL, and for example, may denote an EL peak in a range corresponding to a wavelength range of each EML.

And, FIG. 8 shows a result obtained by measuring the second embodiment of the present disclosure, but results which are the same as the details described above with reference to FIG. 8 may be obtained by measuring the third embodiment of the present disclosure and the fourth embodiment of the present disclosure.

And, in the second to fourth embodiments of the present disclosure, since an emission part including a green EML formed of a phosphorescent material is provided, a lifetime of the organic light emitting display device can be enhanced without any reduction in green lifetime. Hereinafter, results obtained by measuring green lifetime and blue lifetime will be described with reference to FIGS. 9 and 10.

Figure 9:
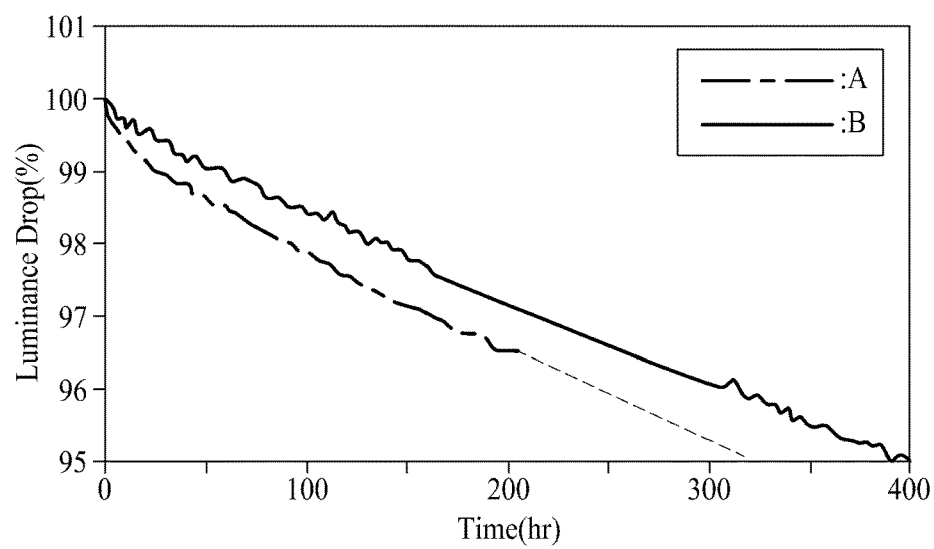
FIG. 9 is a diagram showing green lifetime according to a first embodiment of the present disclosure and a second embodiment of the present disclosure.

FIG. 9 is a diagram showing green lifetime according to the first embodiment of the present disclosure and the second embodiment of the present disclosure.

In FIG. 9, the abscissa axis indicates a time (hr), and the ordinate axis indicates a luminance drop rate (%). Lifetime (T95) denotes a time (i.e., a 95% lifetime (T95) of the organic light emitting device) taken until showing emission luminance corresponding to about 95% of initial emission luminance. Also, A indicates the first embodiment, and B indicates the second embodiment of the present disclosure.

As shown in FIG. 9, in comparison with the first embodiment, it can be seen that in the second embodiment of the present disclosure, the green lifetime is enhanced by about 130%. Accordingly, in the second embodiment of the present disclosure, since a green EML and a yellow-green EML which are formed of a phosphorescent material are provided together, it can be seen that the green lifetime is enhanced without any reduction.

Figure 10:
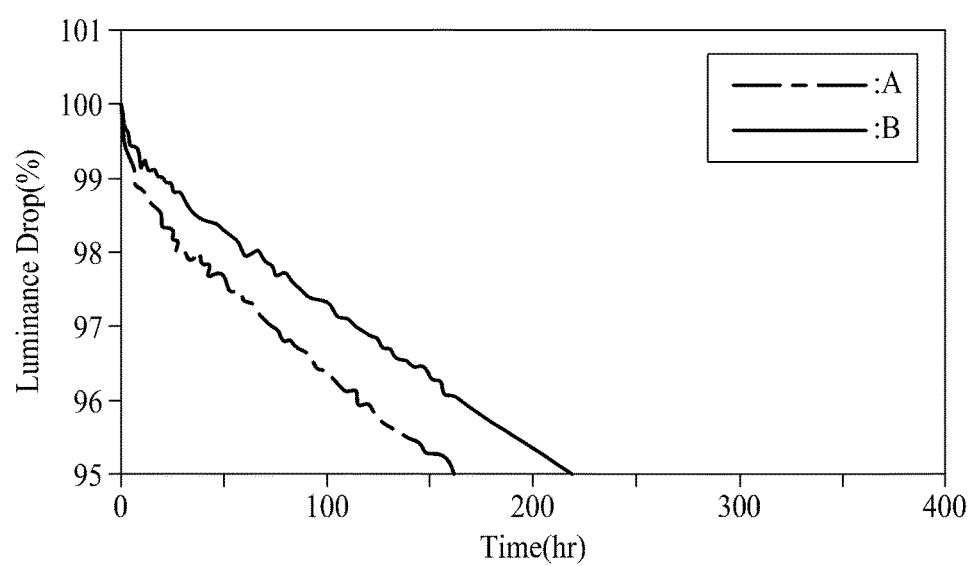
FIG. 10 is a diagram showing blue lifetime according to a first embodiment of the present disclosure and a second embodiment of the present disclosure.

FIG. 10 is a diagram showing blue lifetime according to the first embodiment of the present disclosure and the second embodiment of the present disclosure.

In FIG. 10, the abscissa axis indicates a time (hr), and the ordinate axis indicates a luminance drop rate (%). Lifetime (T95) denotes a time (i.e., a 95% lifetime (T95) of the organic light emitting device) taken until showing emission luminance corresponding to about 95% of initial emission luminance. Also, A indicates the first embodiment, and B indicates the second embodiment of the present disclosure.

As shown in FIG. 10, in comparison with the first embodiment, it can be seen that in the second embodiment of the present disclosure, the blue lifetime is enhanced by about 138%. Accordingly, in comparison with the first embodiment where a yellow-green EML is provided, since a green EML and a yellow-green EML are provided in the second embodiment of the present disclosure, it can be seen that in the second embodiment, charge balance characteristic is enhanced, and thus, the blue lifetime is enhanced.

Moreover, FIGS. 9 and 10 show results obtained by measuring the second embodiment of the present disclosure, but results which are the same as the details described above with reference to FIGS. 9 and 10 may be obtained by measuring the third embodiment of the present disclosure and the fourth embodiment of the present disclosure.

As described above, according to the embodiments of the present disclosure, at least one of at least two emission parts may be configured with at least three emission layers, and one of the at least three emission layers may be configured with a green emission layer and a yellow-green emission layer which each include a phosphorescent material, thereby enhancing a lifetime of an organic light emitting display device including green lifetime without any reduction in lifetime of the green emission layer including the phosphorescent material.

And, according to the embodiments of the present disclosure, at least one of at least two emission parts may include a green emission layer and a yellow-green emission layer, thereby providing an organic light emitting display device where a lifetime of the green emission layer is not shortened.

And, according to the embodiments of the present disclosure, at least one of at least two emission parts may include a red emission layer, a green emission layer, and a yellow-green emission layer, and thus, a digital cinema initiatives (DCI) coverage and a DCI area ratio representing a color reproduction rate are realized by nearly 100% or more, thereby enhancing a color reproduction rate of an organic light emitting display device.

And, according to the embodiments of the present disclosure, at least one of at least two emission parts may include a green emission layer and a yellow-green emission layer, and thus, green lifetime is enhanced, thereby reducing a driving voltage.

The effects of the present disclosure are not limited to the aforesaid, but other effects not described herein will be clearly understood by those skilled in the art from descriptions above.

The details of the present disclosure described in technical problem, technical solution, and advantageous effects do not specify essential features of claims, and thus, the scope of claims is not limited by the details described in detailed description of the disclosure.

According to one or more embodiments of the present disclosure, an organic light emitting display device includes a first emission part between an anode and a cathode and a second emission part on the first emission part, wherein at least one of the first emission part and the second emission part includes at least three emission layers emitting lights of different colors, and one of the at least three emission layers include a green emission layer including a phosphorescent material.

According to one or more embodiments of the present disclosure, the at least three emission layers may include a red emission layer and a yellow-green emission layer.

According to one or more embodiments of the present disclosure, the red emission layer may be disposed adjacent to the yellow-green emission layer.

According to one or more embodiments of the present disclosure, the red emission layer may be disposed adjacent to the green emission layer.

According to one or more embodiments of the present disclosure, a peak wavelength of light emitted from each of the first emission part and the second emission part may be within a range of 456±10 nm, 530±10 nm, 560±10 nm, and 625±15 nm.

According to one or more embodiments of the present disclosure, the organic light emitting display device may further include a third emission part on the second emission part.

According to one or more embodiments of the present disclosure, light emitted from the first emission part, the second emission part, and the third emission part may include at least four peak wavelengths.

According to one or more embodiments of the present disclosure, peak wavelengths of lights emitted from the first emission part, the second emission part, and the third emission part may be within a range of 456±10 nm, 530±10 nm, 560±10 nm, and 625±15 nm.

According to one or more embodiments of the present disclosure, at least two of the first emission part, the second emission part, and the third emission part may include emission layers emitting light of a same color.

According to one or more embodiments of the present disclosure, the at least two emission parts with the emission layers emitting light of the same color may be disposed adjacent to each other.

According to one or more embodiments of the present disclosure, a peak wavelength of the emission layers emitting light of the same color may be within a range of 456±10 nm.

According to one or more embodiments of the present disclosure, the organic light emitting display device may further include a charge generation layer in at least one of between the first emission part and the second emission part and between the second emission part and the third emission part.

According to one or more embodiments of the present disclosure, an organic light emitting display device includes at least two emission parts stacked between an anode and a cathode, wherein at least one of the at least two emission parts includes a first emission layer, a second emission layer including a phosphorescent material for emitting green light, and a third emission layer configured for enhancing a color reproduction rate and lifetime of the phosphorescent material.

According to one or more embodiments of the present disclosure, the first emission layer may include a red emission layer, and the third emission layer may include a yellow-green emission layer.

According to one or more embodiments of the present disclosure, the first emission layer may be disposed adjacent to the second emission layer.

According to one or more embodiments of the present disclosure, the first emission layer may be disposed adjacent to the third emission layer.

According to one or more embodiments of the present disclosure, a peak wavelength of light emitted from each of the at least two emission parts may be within a range of 456±10 nm, 530±10 nm, 560±10 nm, and 625±15 nm.

According to one or more embodiments of the present disclosure, an organic light emitting display device includes at least two emission parts between an anode and a cathode, wherein at least one of the at least two emission parts includes at least three emission layers, the at least three emission layers emitting light of different colors.

According to one or more embodiments of the present disclosure, the at least three emission layers may include a green emission layer, a red emission layer, and a yellow-green emission layer, and the at least three emission layers may be arranged with energy band gaps increasing towards the cathode.

According to one or more embodiments of the present disclosure, the at least three emission layers may include a green emission layer, a red emission layer, and a yellow-green emission layer, and the red emission layer may be adjacent to the green emission layer or the yellow-green emission layer.

According to one or more embodiments of the present disclosure, an organic light emitting display device includes at least two emission parts between an anode and a cathode, at least one of the at least two emission parts includes at least three emission layers, and the at least three emission layers include a green emission layer comprising a phosphorescent material for emitting green light.

According to one or more embodiments of the present disclosure, the at least three emission layers may emit light of different colors.

According to one or more embodiments of the present disclosure, the at least three emission layers may further comprise a red emission layer and a yellow-green emission layer.

According to one or more embodiments of the present disclosure, the red emission layer may be closer to the anode than the yellow-green emission layer.

According to one or more embodiments of the present disclosure, the at least three emission layers may be stacked one on the other, and the red emission layer may be disposed adjacent to the yellow-green emission layer.

According to one or more embodiments of the present disclosure, the at least three emission layers may be stacked one on the other, and the red emission layer may be disposed adjacent to the green emission layer.

According to one or more embodiments of the present disclosure, the organic light emitting display device may further include a third emission part on the second emission part, the first, second and third emission parts may be stacked one on the other between the cathode and the anode.

According to one or more embodiments of the present disclosure, light emitted from the first emission part, the second emission part, and the third emission part may comprise at least four peak wavelengths.

According to one or more embodiments of the present disclosure, at least two of the first emission part, the second emission part, and the third emission part comprise emission layers emitting light of a same color.

According to one or more embodiments of the present disclosure, the emission parts with the emission layers emitting light of the same color may be disposed adjacent to each other.

According to one or more embodiments of the present disclosure, a peak wavelength of the emission layers emitting light of the same color may be within a range of 456±10 nm.

According to one or more embodiments of the present disclosure, peak wavelengths of light emitted from the emission parts may be within a range of 456±10 nm, a range of 530±10 nm, a range of 560±10 nm, and a range of 625±15 nm.

According to one or more embodiments of the present disclosure, the emission layers may be arranged with energy band gaps increasing towards the cathode.

According to one or more embodiments of the present disclosure, the organic light emitting display device may further include a charge generation layer between two adjacent emission parts.

According to one or more embodiments of the present disclosure, the emission parts may further comprise at least one of a hole transporting layer, a hole injecting layer, an electrode transporting layer, an electrode injecting layer, a hole blocking layer and an electrode blocking layer.

According to one or more embodiments of the present disclosure, the anode may be formed of a transparent conductive material.

It will be apparent to those skilled in the art that various modifications and variations can be made in the present disclosure without departing from the spirit or scope of the disclosure. Thus, it is intended that the present disclosure covers the modifications and variations of this disclosure provided they come within the scope of the appended claims and their equivalents.

What is claimed is:

1. An organic light emitting display device, comprising:
   a first emission part between an anode and a cathode, the first emission part including:
      a first hole transport layer;
      a first emission portion; and
      a first electron transport layer; and
   a second emission part on the first emission part, the second emission part including:
      a second hole transport layer;
      a second emission portion; and
      a second electron transport layer,
   wherein at least one of the first emission portion and the second emission portion includes at least three emission layers emitting lights of different colors,
   wherein one of the at least three emission layers includes a green emission layer including a phosphorescent material, and
   wherein the at least three emission layers include:
      a red emission layer,
      the green emission layer, and
      a yellow-green emission layer.

2. The organic light emitting display device of claim 1, wherein the red emission layer is adjacent to the yellow-green emission layer.

3. The organic light emitting display device of claim 1, wherein the red emission layer is adjacent to the green emission layer.

4. The organic light emitting display device of claim 1, wherein a peak wavelength of light emitted from each of the first emission part and the second emission part is within a range of 456±10 nm, 530±10 nm, 560±10 nm, and 625±15 nm.

5. The organic light emitting display device of claim 1, further comprising a third emission part on the second emission part.

6. The organic light emitting display device of claim 5, wherein light emitted from the first emission part, the second emission part, and the third emission part includes at least four peak wavelengths.

7. The organic light emitting display device of claim 5, wherein peak wavelengths of lights emitted from the first emission part, the second emission part, and the third emission part are within a range of 456±10 nm, 530±10 nm, 560±10 nm, and 625±15 nm.

8. The organic light emitting display device of claim 5, wherein at least two of the first emission part, the second emission part, and the third emission part include emission layers emitting light of a same color.

9. The organic light emitting display device of claim 8, wherein the at least two emission parts with the emission layers emitting light of the same color are adjacent to each other.

10. The organic light emitting display device of claim 8, wherein a peak wavelength of the emission layers emitting light of the same color is within a range of 456±10 nm.

11. The organic light emitting display device of claim 5, further comprising a charge generation layer in at least one of between the first emission part and the second emission part and between the second emission part and the third emission part.

12. An organic light emitting display device, comprising:
   at least two emission parts between an anode and a cathode, each of the at least two emission parts respectively including:
      a hole transport layer;
      an emission portion; and
      a electron transport layer,
   wherein at least one emission portion of the at least one of the at least two emission parts includes:
      a first emission layer,
      a second emission layer including a phosphorescent material for emitting green light, and
      a third emission layer configured for enhancing a color reproduction rate and lifetime of the phosphorescent material, and
   wherein the at least three emission layers include:
      a red emission layer,
      a green emission layer, and
      a yellow-green emission layer.

13. The organic light emitting display device of claim 12, wherein the first emission layer is adjacent to the second emission layer.

14. The organic light emitting display device of claim 12, wherein the first emission layer is adjacent to the third emission layer.

15. The organic light emitting display device of claim 12, wherein a peak wavelength of light emitted from each of the at least two emission parts is within a range of 456±10 nm, 530±10 nm, 560±10 nm, and 625±15 nm.

16. An organic light emitting display device, comprising:
at least two emission parts between an anode and a cathode, each of the at least two emission parts respectively including:
a hole transport layer;
an emission portion; and
a electron transport layer,
wherein at least one emission portion of the at least one of the at least two emission parts includes at least three emission layers, the at least three emission layers emitting light of different colors, and
wherein the at least three emission layers include:
a red emission layer,
a green emission layer, and
a yellow-green emission layer.

17. The organic light emitting display device of claim 16, wherein the at least three emission layers are arranged with energy band gaps increasing towards the cathode.

18. The organic light emitting display device of claim 16, wherein the red emission layer is adjacent to the green emission layer or the yellow-green emission layer.

19. The organic light emitting display device of claim 1, wherein the at least three emission layers are in a stack formation.

20. The organic light emitting display device of claim 12, wherein the at least three emission layers are in a stack formation.

* * * * *